(12) United States Patent
Nam et al.

(10) Patent No.: US 11,201,199 B2
(45) Date of Patent: Dec. 14, 2021

(54) CHIP ON FILM PACKAGE INCLUDING A PROTECTION LAYER AND DISPLAY DEVICE INCLUDING THE CHIP ON FILM PACKAGE

(71) Applicant: SAMSUNG DISPLAY CO., LTD., Yongin-si (KR)

(72) Inventors: Ki-Soo Nam, Asan-si (KR); Gi Young Kang, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 91 days.

(21) Appl. No.: 16/385,297

(22) Filed: Apr. 16, 2019

(65) Prior Publication Data

US 2019/0319082 A1 Oct. 17, 2019

(30) Foreign Application Priority Data

Apr. 17, 2018 (KR) .................. 10-2018-0044647

(51) Int. Cl.
*H01L 27/32* (2006.01)
*H01L 23/31* (2006.01)
*H01L 23/538* (2006.01)
*H01L 23/00* (2006.01)

(52) U.S. Cl.
CPC ...... *H01L 27/3255* (2013.01); *H01L 23/3185* (2013.01); *H01L 23/5386* (2013.01); *H01L 23/5387* (2013.01); *H01L 24/16* (2013.01); *H01L 27/3276* (2013.01); *H01L 2224/16227* (2013.01); *H01L 2924/1426* (2013.01)

(58) Field of Classification Search
CPC ............. H01L 27/3255; H01L 27/3276; H01L 23/3185; H01L 23/5386; H01L 23/5387; H01L 24/16; H01L 2924/1426; H01L 2224/16227; H01L 2224/17133; H01L 24/17; H01L 2924/14; H01L 2224/16225; H01L 24/13; H01L 27/1218; H01L 27/124; H01L 23/4985; G02F 1/13458; G02F 1/13452
See application file for complete search history.

(56) References Cited

U.S. PATENT DOCUMENTS

| | | | | |
|---|---|---|---|---|
| 6,303,997 | B1 * | 10/2001 | Lee .................... | H01L 23/13 257/778 |
| 8,421,720 | B2 | 4/2013 | He et al. | |
| 2002/0064905 | A1 * | 5/2002 | Park .................. | H01L 25/0655 438/109 |
| 2002/0117729 | A1 * | 8/2002 | Aiki .................. | G01R 31/2884 257/459 |
| 2006/0221290 | A1 * | 10/2006 | So ..................... | G02F 1/13452 349/149 |

(Continued)

*Primary Examiner* — Duy T Nguyen
(74) *Attorney, Agent, or Firm* — F. Chau & Associates, LLC

(57) ABSTRACT

A chip on film package includes: a base substrate having an output pad region; a plurality of output pads disposed in the output pad region of the base substrate, wherein the output pads are arranged in a zigzag configuration on the base substrate; a plurality of output pad wirings connected to the output pads, respectively; and a protection layer disposed on the output pad wirings. The protection layer is disposed on the output pad wirings disposed between two adjacent output pads, arranged in a first direction.

15 Claims, 12 Drawing Sheets

(56) References Cited

U.S. PATENT DOCUMENTS

| | | | |
|---|---|---|---|
| 2007/0152329 A1* | 7/2007 | Cho | H01L 24/06 257/734 |
| 2008/0111255 A1* | 5/2008 | Matsuoka | H01L 24/49 257/786 |
| 2009/0153765 A1* | 6/2009 | Yamashita | H01L 24/17 349/58 |
| 2011/0148827 A1* | 6/2011 | Ishida | G09G 3/3688 345/204 |
| 2016/0105952 A1* | 4/2016 | Park | G02F 1/1309 345/174 |

* cited by examiner

CHIP ON FILM PACKAGE INCLUDING A PROTECTION LAYER AND DISPLAY DEVICE INCLUDING THE CHIP ON FILM PACKAGE

CROSS-REFERENCE TO RELATED APPLICATION

This application claims priority under 35 U.S.C. § 119 to Korean Patent Application No. 10-2018-0044647, filed on Apr. 17, 2018 in the Korean Intellectual Property Office (KIPO), the disclosure of which is incorporated by reference herein in its entirety.

TECHNICAL FIELD

Exemplary embodiments of the present inventive concept relate generally to a chip on film package and a display device including the chip on film package. More particularly, exemplary embodiments of the present inventive concept relate to a chip on film package including a protection layer and a display device including the chip on film package.

DISCUSSION OF THE RELATED ART

A flat panel display (FPD) device is widely used as a display device of an electronic device because the FPD device is lightweight and thin compared to a cathode-ray tube (CRT) display device. Examples of the FPD device include a liquid crystal display (LCD) device and an organic light emitting display (OLED) device.

A display panel included in a display device may receive scan signals, data signals, etc. from an external device to display an image. Here, the display panel may be connected to the external device through a flexible printed circuit board (e.g., a chip on film). As a size and a resolution of the display device becomes larger, the number of signals provided to the display device may increase, and the display device may include a large number of pad electrodes to receive the signals from the external device. Here, pads of the chip on film may be connected to the pad electrodes of the display device. However, as the large number of the pad electrodes are disposed in a limited space of the display device, a distance between adjacent pad electrodes may decrease, and a distance between adjacent pads may decrease. Accordingly, a process margin may be reduced due to the decreased distance between adjacent pads in a process for bonding the pads of the chip on film and the pad electrodes of the display device. In other words, if an alignment error occurs between the pads of the chip on film and the pad electrode of the display device, a contact failure between the pads and the pad electrodes may be generated by contacting the pad electrodes and the output pad wiring of the chip on film.

SUMMARY

According to an exemplary embodiment of the present inventive concept, a chip on film package includes: a base substrate having an output pad region; a plurality of output pads disposed in the output pad region of the base substrate, wherein the output pads are arranged in a zigzag configuration on the base substrate; a plurality of output pad wirings connected to the output pads, respectively; and a protection layer disposed on the output pad wirings. The protection layer is disposed on the output pad wirings disposed between two adjacent output pads, arranged in a first direction.

In an exemplary embodiment of the present inventive concept, the output pad region is located adjacent to a first side of the base substrate. The output pad region includes: a first region located adjacent to the first side; and a second region located adjacent to the first region and spaced apart from the first side in a second direction that is perpendicular to the first direction.

In an exemplary embodiment of the present inventive concept, the output pads include: lower output pads arranged along the first direction in the first region of the output pad region; and upper output pads arranged along the first direction in the second region of the output pad region. The lower and upper output pads are alternately disposed in the first direction.

In an exemplary embodiment of the present inventive concept, the lower output pads do not overlap the upper output pads in the second direction.

In an exemplary embodiment of the present inventive concept, the base substrate further includes: an input pad region located adjacent to a second side, opposite to the first side, of the base substrate. The chip on film package further includes: a plurality of input pads disposed in the input pad region of the base substrate; and a driving integrated circuit chip disposed on the base substrate and between the output pads and the input pads.

In an exemplary embodiment of the present inventive concept, the output pad wirings include: lower output pad wirings connected to the lower output pads, respectively; and upper output pad wirings connected to the upper output pads, respectively. A first side of each of the lower and upper output pad wirings is connected to a respective output pad of the plurality of output pads, and a second side of each of the lower and upper output pad wirings is connected to the driving integrated circuit chip.

In an exemplary embodiment of the present inventive concept, the lower output pad wiring disposed between two adjacent upper output pads along the first direction among the upper output pads is completely covered by the protection layer.

In an exemplary embodiment of the present inventive concept, the protection layer has a protrusion that covers the lower output pad wiring disposed between the two adjacent upper output pads arranged in the first direction.

In an exemplary embodiment of the present inventive concept, the protrusion of the protection layer is disposed on the lower output pad wiring disposed between the two adjacent upper output pads arranged in the first direction, and exposes a portion of the lower output pad wiring located adjacent to a first lower output pad of the lower output pads such that the protrusion is spaced apart from the first lower output pad by a predetermined distance.

In an exemplary embodiment of the present inventive concept, a first distance is a distance between the protrusion of the protection layer and the first lower output pad in the second direction, and a second distance is a distance between the first lower output pad and an upper output pad of the two adjacent upper output pads in the second direction. The first distance is less than the second distance.

In an exemplary embodiment of the present inventive concept, the protection layer has an opening exposing the output and input pads and the driving integrated circuit chip, and is disposed on the entire base substrate to cover the output pad wirings.

In an exemplary embodiment of the present inventive concept, a height from an upper surface of the base substrate to an upper surface the protection layer is greater than a height from the upper surface of the base substrate to an upper surface of each of the output and input pads.

In an exemplary embodiment of the present inventive concept, the plurality of the output pads include: first through (M)th lower output pads, wherein M is an integer greater than 1, and first through (N)th upper output pads, wherein N is an integer greater than 1. The plurality of the output pad wirings include: first through (P)th lower output pad wirings, wherein P is an integer greater than 1; and first through (Q)th upper output pad wirings. Q is an integer greater than 1.

In an exemplary embodiment of the present inventive concept, the first through (M)th lower output pads and the first through (N)th upper output pads are alternately arranged along the first direction in different rows, and a (K)th lower output pad among the first through (M)th lower output pads is connected to an (L)th lower output pad wiring among the first through (P)th lower output pad wirings. K is an integer between 1 and M and L is an integer between 1 and M. A (G)th upper output pad among the first through (N)th upper output pads is connected to an (H)th upper output pad wiring among the first through (Q)th upper output pad wirings. G is an integer between 1 and M, and H is an integer between 1 and M.

In an exemplary embodiment of the present inventive concept, the (L)th lower output pad wiring disposed between the (G)th upper output pad and a (G+1)th upper output pad is completely covered by the protection layer.

According to an exemplary embodiment of the present inventive concept, a display device includes: a display panel having a pixel region and a pad region. The display panel includes: a plurality of pixel structures disposed in the pixel region; and a plurality of pad electrodes disposed in the pad region, wherein the pad electrodes are arranged in a zigzag configuration; a chip on film package including: a base substrate having an output pad region; a plurality of output pads disposed in the output pad region of the base substrate, wherein the output pads are arranged in a zigzag configuration on the base substrate; a plurality of output pad wirings connected to the output pads, respectively; and a protection layer disposed on the output pad wirings, wherein the output pads overlap the pad electrodes of the display panel, and the protection layer is disposed on the output pad wirings disposed between two adjacent output pads, arranged in a first direction; and an external device connected to the chip on film package. The external device generates a plurality of signals that are provided to the display panel.

In an exemplary embodiment of the present inventive concept, the plurality of the output pads include: first through (M)th lower output pads, wherein M is an integer greater than 1, and first through (N)th upper output pads. N is an integer greater than 1, and the plurality of the output pad wirings include: first through (P)th lower output pad wirings, wherein P is an integer greater than 1; and first through (Q)th upper output pad wirings. Q is an integer greater than 1.

In an exemplary embodiment of the present inventive concept, the first through (M)th lower output pads and the first through (N)th upper output pads are alternately arranged along the first direction in different rows, and a (K)th lower output pad among the first through (M)th lower output pads is connected to an (L)th lower output pad wiring among the first through (P)th lower output pad wirings. K is an integer between 1 and M and L is an integer between 1 and M, and a (G)th upper output pad among the first through (N)th upper output pads is connected to an (H)th upper output pad wiring among the first through (Q)th upper output pad wirings. G is an integer between 1 and M, and H is an integer between 1 and M.

In an exemplary embodiment of the present inventive concept, the (L)th lower output pad wiring disposed between the (G)th upper output pad and a (G+1)th upper output pad is completely covered by the protection layer.

In an exemplary embodiment of the present inventive concept, the plurality of the pad electrodes include: first through (R)th lower pad electrodes, wherein R is an integer greater than 1; and first through Nth upper pad electrodes. S is an integer greater than 1. The first through (R)th lower pad electrodes and the first through (S)th upper pad electrodes are alternately arranged along the first direction in different rows. An (E)th lower pad electrode among the first through (R)th lower pad electrodes is connected to the (G)th upper output pad. E is an integer between 1 and R, and an (F)th upper pad electrode among the first through (S)th upper pad electrodes is connected to the (K)th lower output pad. F is an integer between 1 and S.

According to an exemplary embodiment of the present inventive concept, a chip on film package includes: a substrate having a first region; a plurality of first pads disposed in the first region, wherein the first pads are arranged in a first direction on the substrate; a plurality of first pad wirings connected to the first pads, respectively, and extending in a second direction crossing the first direction; and a protection layer disposed on the first pad wirings. The protection layer extends toward the first pads.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Hereinafter, exemplary embodiments of the present inventive concept will be described more fully hereinafter with reference to the accompanying drawings.

Figure 1:
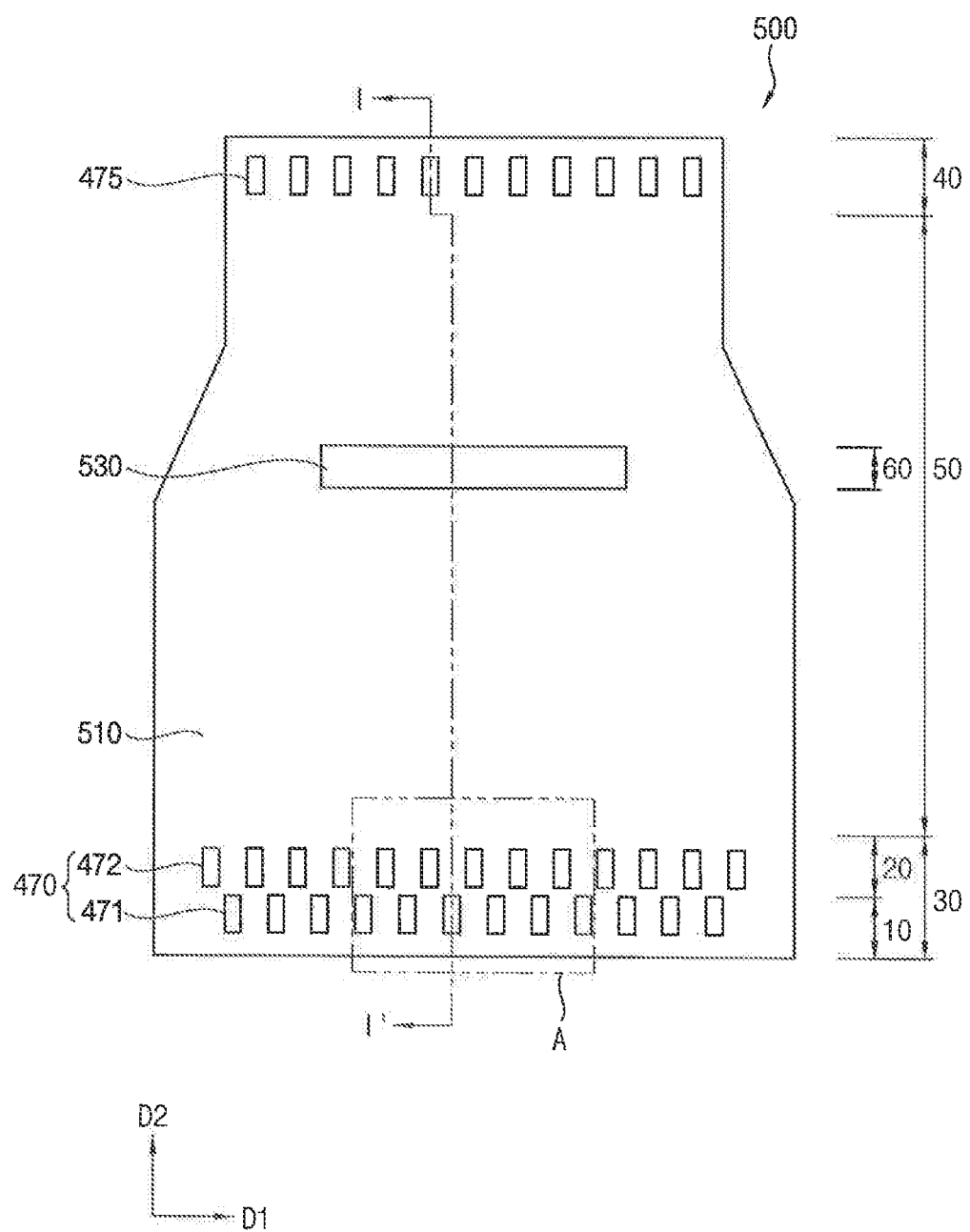
FIG. 1 is a plan view illustrating a chip on film package according to an exemplary embodiment of the present inventive concept.
Figure 2:
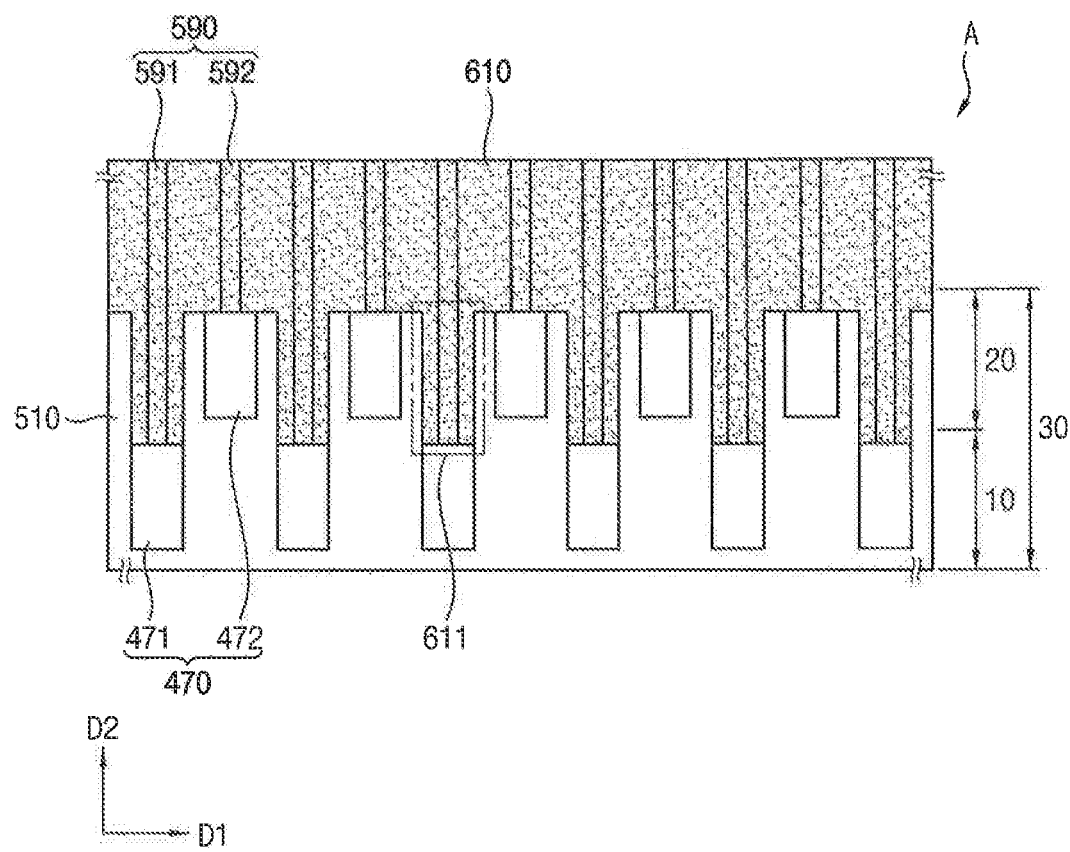
FIG. 2 is an enlarged plan view corresponding to region 'A' of the chip on film package of FIG. 1 according to an exemplary embodiment of the present inventive concept.
Figure 3:
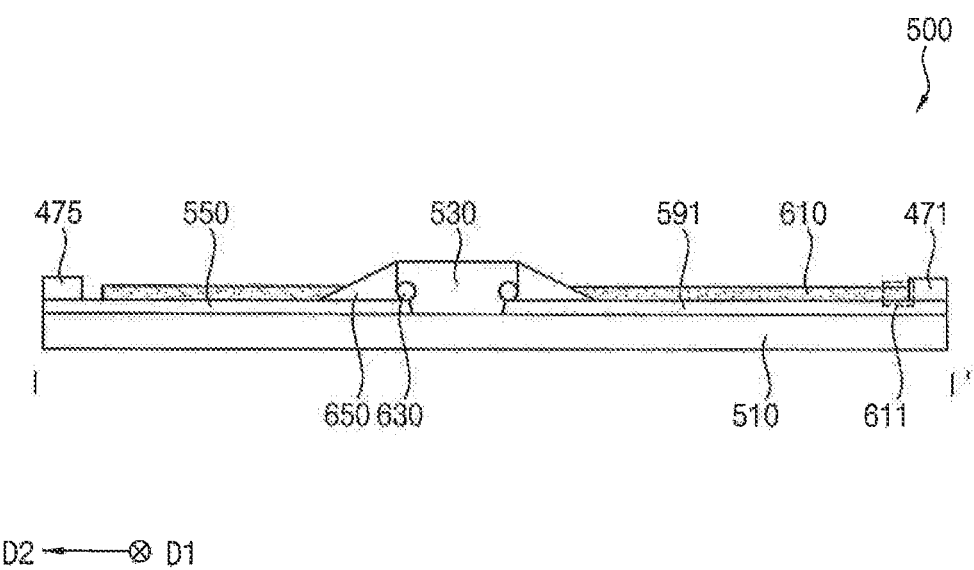
FIG. 3 is a cross-sectional view taken along a line I-I' of the chip on film package of FIG. 1 according to an exemplary embodiment of the present inventive concept.

FIG. 1 is a plan view illustrating a chip on film package according to an exemplary embodiment of the present inventive concept, and FIG. 2 is an enlarged plan view corresponding to region 'A' of the chip on film package of FIG. 1 according to an exemplary embodiment of the present inventive concept. FIG. 3 is a cross-sectional view taken along a line of the chip on film package of FIG. 1 according to an exemplary embodiment of the present inventive concept.

Referring to FIGS. 1, 2, and 3, a chip on film package 500 may include a base substrate 510, a driving integrated circuit (IC) chip 530, a plurality of output pads 470, a plurality of input pads 475, a plurality of output pad wirings 590, a protection layer 610, a plurality of input pad wirings 550, an electrode bump 630, and an encapsulation pattern 650. Here, the output pads 470 may include lower output pads 471 and upper output pads 472, and the output pad wirings 590 may include lower output pad wirings 591 and upper output pad wirings 592. For example, the output pads 470 and the input pads 475 may be arranged in a first direction D1 that is in parallel to an adjacent side of the base substrate 510, and the output pad wirings 590 and the input pad wirings 550 may extend in a second direction D2 that is perpendicular to the first direction D1. In addition, the input pad wirings 550 and the output pad wirings 590 may be arranged along the first direction D1. Here, the input pad wirings 550 may connect the input pads 475 and the driving IC chip 530, and the output pad wirings 590 may connect the output pads 470 and the driving IC chip 530.

In an exemplary embodiment of the present inventive concept, in a plan view of FIG. 1, the output pads 470 may be alternately arranged in a zigzag manner on a plan surface of the base substrate 510. For example, a first row of output pads 470 may be misaligned with a second row of output pads 470. In addition, in a plan view of FIG. 2, the protection layer 610 may be disposed on the output pad wirings 590 disposed between adjacent two output pads 470, which are arranged in the first direction D1, among the output pads 470.

In other words, the plurality of the output pads 470 may include first through (M)th lower output pads 471 and first through (N)th upper output pads 472, where M is an integer greater than 1, and N is an integer greater than 1. The plurality of the output pad wirings 590 may include first through (P)th lower output pad wirings 591 and first through (Q)th upper output pad wirings 592, where P is an integer greater than 1, and Q is an integer greater than 1, in an exemplary embodiment of the present inventive concept, the first through (M)th lower output pads 471 and the first through (N)th upper output pads 472 may be alternately arranged along the first direction. D1 in different rows. In addition, the (K)th lower output pad among the first through (M)th lower output pads 471 may be connected to the (L)th lower output pad wiring among the first through (P)th lower output pad wirings 491, where K is an integer between 1 and M, and L is an integer between 1 and M. The (G)th upper output pad among the first through (N)th upper output pads 592 may be connected to the (H)th upper output pad wiring among the first through (Q)th upper output pad wirings 592, where G is an integer between 1 and M, and H is an integer between 1 and M. Further, the (L)th lower output pad wiring may be disposed between the (G)th and (G+1)th upper output pads, and the (L)th lower output pad wiring may be covered by the protection layer 610. For example, the (L)th lower output pad wiring may be completely covered by the protection layer 610.

As illustrated in FIG. 1, the base substrate 510 may have an output pad region 30, an input pad region 40, a driving IC region 60, and a pad wiring region 50. Here, the output pad region 30 may include a first region 10 and a second region 20.

The output pad region 30 may be located in a first side portion of the base substrate 510, and the input pad region 40 may be located in a second side portion, which is opposite to the first side portion, of the base substrate 510. For example, the output pad region 30 may be adjacent to a first side of the base substrate 510, and the input pad region 40 may be adjacent to a second side, opposite the first side, of the base substrate 510. Here, the first region 10 of the output pad region 30 may be located adjacent to the first side portion, and the second region 20 may be located adjacent to the first region 10 to be spaced apart from the first side portion by the second direction D2. In other words, the first region 10 is disposed between the first side portion and the second region 20. The pad wiring region 50 may be disposed between the output pad region 30 and the input pad region 40, and the driving IC region 60 may be located in a portion of the pad wiring region 50.

The lower output pads 471 may be disposed in the first region 10, and the upper output pads 472 may be disposed in the second region 20. In addition, the input pads 475 may be disposed in the input pad region 40. Further, the input pad wirings 550 and the output pad wirings 590 may be disposed in the pad wiring region 50, and the driving IC chip 530 may be disposed in the driving IC region 60.

For example, the output pads 470 may connect a display panel capable of displaying an image, and the input pads 475 may connect an external device capable of generating a plurality of signals. The external device may generate data signals, scan signals, light emission signals, power supply voltages, touch sensing signals, etc., and may provide the data signals, the scan signals, the light emission signals, the power supply voltages, the touch sensing signals, etc. to the display panel through the chip on film package 500.

In an exemplary embodiment of the present inventive concept, the chip on film package 500 may have a polygonal shape from a plan view, but the present inventive concept is not limited thereto. For example, in an exemplary embodiment of the present inventive concept, the chip on film package 500 may have triangular shape from a plan view, a pentagonal shape from a plan view, a tetragonal shape from a plan view, a circular shape from a plan view, an elliptical shape from a plan view, or an oval shape from a plan view.

As illustrated in FIGS. 2 and 3, the lower output pads 471 may be arranged along, the first direction D1 in the first region 10 of the output pad region 30, and the upper output pads 472 may be arranged along the first direction D1 in the second region 20 of the output pad region 30. In an exemplary embodiment of the present inventive concept, the lower output pads 471 and the upper output pads 472 may be alternately disposed in the first direction D1, and each of the lower output pads 471 might not overlap each of the upper output pads 472 in the second direction D2. For example, the row of lower output pads 471 may be misaligned with the row of upper output pads 472.

Each of the lower output pad wirings 591 may be connected to each of the lower output pads 471, and each of the upper output pad wirings 592 may be connected to each of the upper output pads 472. For example, a first side of the lower output pad wiring 591 may be connected to (or may be in direct contact with the lower output pad 471, and a second side, which is different from the first side, of the lower output pad wiring 591 may be connected to the driving IC chip 530. In addition, a first side of the upper output pad wiring 592 may be connected to the upper output pad 472, and a second side, which is different from the first side, of the upper output pad wiring 592 may be connected to the driving IC chip 530.

In an exemplary embodiment of the present inventive concept, the lower output pad wiring 591 may be disposed between two adjacent upper output pads 472, in the first direction D1, among the upper output pads 472. Further, the lower output pad wiring 591 may be completely covered by the protection layer 610. In other words, the lower output pad wiring 591 that is connected to the lower output pad 471 may be disposed between two adjacent upper output pads 472, and the protection layer 610 may have a protrusion 611 covering the lower output pad wiring 591 disposed between the two adjacent the upper output pads 472. Here, the protection layer 610 may be disposed in the pad wiring region 50 and the second region 20 on the base substrate 510, and the protrusion 611 may correspond to a portion where the protection layer 610 is disposed in the second region 20. In other words, in the protection layer 610, the protrusion 611 of the protection layer 610 may be a portion protruded from a boundary of the pad wiring region 50 and into the output pad region 30 by a direction that is opposite to the second direction D2. The protrusion 611 may be in direct contact with the upper output pads 472. In addition, the protrusion 611 may be in direct contact with the two adjacent upper output pads 472 by enlarging a width in the first direction D1 of the protrusion 611.

For example, as a size and a resolution of a display device becomes larger, the number of signals provided to the display device may be increased, and the display device may include the relatively large number of pad electrodes such that display device receives the signals from the external device. Here, output pads of a conventional chip on film may be connected to the pad electrodes of the display device. However, as the relatively large number of the pad electrodes are disposed in a limited sized space of the display device, a distance between the pad electrodes may be relatively small, and a process margin may be reduced due to the relatively decreased distance of the pads in a process for bonding the output pads of the conventional chip on film and the pad electrodes of the display device. In other words, when an alignment error occurs between the output pads of the chip on film and the pad electrode of the display device, a contact failure of the output pads and the pad electrodes may be generated by contacting the pad electrodes and the output pad wiring of the conventional chip on film. In other words, a protection layer of the conventional chip on film package might not have a protrusion.

In an exemplary embodiment of the present inventive concept, as the protection layer 610 of the chip on film package 500 includes the protrusion 611 and in a process for bonding pad electrodes of a display device and the output pads 470 of the chip on film package 500, although the alignment error may occur, the pad electrode of the display device might not be in contact with the lower output pad wiring 591 because the protrusion 611 of the protection layer 610 covers the lower output pad wiring 591. Accordingly, a contact failure of the lower output pad wiring 591 of the chip on film package 500 and the pad electrodes of the display device may be prevented.

Referring again to FIGS. 1, 2, and 3, the base substrate 510 may be provided. The base substrate 510 may include a flexible film including a flexible material. For example, the base substrate 510 may include a polyimide resin, a polyester region, etc.

The driving IC chip 530 may be disposed in the driving IC region 60 on the base substrate 510. Input signals and driving IC power supply voltages from the external device may be provided to the driving IC chip 530, and the driving IC chip 530 may provide output signals to the display device based on the input signals. Accordingly, the driving IC chip 530 may control a driving of the display device.

The input pad wirings 550 may be disposed to be spaced apart from each other in the pad wiring region 50, which is between the input pad region 40 and the driving IC region 60, on the base substrate 510. Here, a first distal end of the input pad wiring 550 may be in contact with the input pad 475, and a second distal end, which is opposite to the first distal end, of the input pad wiring 550 may be connected to the driving IC chip 530. For example, the electrode bump 630 may be disposed between the driving IC chip 530 and the input pad wiring 550, and the input pad wiring 550 may be electrically connected to the driving IC chip 530 through the electrode bump 630. The electrode bump 630 may include, for example, a metal, an alloy of a metal, metal nitride, conductive metal oxide, transparent conductive material, etc. Accordingly, the input pad wiring 550 may electrically connect the driving IC chip 530 and the external device. For example, the input pad wiring 550 may include, for example, a metal, an alloy of a metal, metal nitride, conductive metal oxide, transparent conductive material, etc. These may be used alone or in a combination thereof. In an exemplary embodiment of the present inventive concept, the input pad wiring 550 may have a multi-layered structure including a plurality of layers. However, the present inventive concept is not limited thereto. For example, the input pad wiring 550 may be a single-layered structure.

The output pad wirings 590 may be disposed to be spaced apart from each other in the pad wiring region 50, which is between the driving IC region 60 and the output pad region 30, on the base substrate 510. In an exemplary embodiment of the present inventive concept, the lower output pad wiring 591 may be disposed in the second region 20 of the output pad region 30.

Here, a first distal end of the output pad wiring 590 may be in contact with the output pad 470, and a second distal end, which is opposite to the first distal end, of the output pad wiring 590 may be connected to the driving IC chip 530.

As illustrated in FIG. 3, a first distal end of the lower output pad wiring 591 may be in contact with the lower output pad 471, and a second distal end, opposite the first distal end, of the lower output pad wiring 591 may be connected to the driving IC chip 530. In a different cross-sectional view of the chip on film package 500, a first distal end of the upper output pad wiring 592 may be in contact with the upper output pad 472, and a second distal end, opposite the first distal end, of the upper output pad wiring 592 may be connected to the driving IC chip 530. For example, the electrode bump 630 may be disposed between the driving IC chip 530 and the output pad wiring 590, and the output pad wiring 590 may be electrically connected to the driving IC, chip 530 through the electrode bump 630. The electrode bump 630 may include may include, for example, a metal, an alloy of a metal, metal nitride, conductive metal oxide, transparent conductive material, etc. Accordingly, the output pad wiring 590 may electrically connect the driving IC chip 530 and the display device. For example, the output pad wiring 590 may include, for example, a metal, an alloy of a metal, metal nitride, conductive metal oxide, transparent conductive material, etc. These may be used alone or in a combination thereof. In an exemplary embodiment of the present inventive concept, the output pad wiring 590 may have a multi-layered structure including a plurality of layers. However, the present inventive concept is not limited thereto. For example, the input pad wiring 550 may be a single-layered structure.

The encapsulation pattern 650 may be disposed adjacent to the driving IC chip 530 on the input pad wiring 550 and the output pad wiring 590. The encapsulation pattern 650 may surround a side portion of the driving IC chip 530, and may cover the electrode bump 630. For example, the encapsulation pattern 650 may cover side portions of the driving IC chip 530. The encapsulation pattern 650 may include a material having a high thermal conductivity to release a heat generated from the driving IC chip 530. For example, the encapsulation pattern 650 may include epoxy resin or silicon resin.

The protection layer 610 may be disposed on the input pad wiring 550 and the output pad wiring 590. The protection layer 610 may protect the input pad wiring 550 and the output pad wiring 590. In an exemplary embodiment of the present inventive concept, the protection layer 610 may have the protrusion 611, and the protrusion 611 may be in contact with the lower output pad 471. The protection layer 610 may include solder resist. In addition, the protection layer 610 may include insulation materials such as a silicon compound, a metal oxide, etc. For example, after a preliminary protection layer is formed on the entire base substrate 510, the protection layer 610 may be formed by selectively etching the preliminary protection layer.

The input pads 475 and the output pads 470 may be disposed on both lateral portions of the base substrate 510. The input pad 475 may be disposed on the input pad wiring 550, and the output pads 470 may be disposed on the output pad wiring 590. In an exemplary embodiment of the present inventive concept, the lower output pad 471 may be disposed on the lower output pad wiring 591, and the upper output pad 472 may be disposed on the upper output pad wiring 592. For example, the output pads 470 may be connected to the display device capable of displaying an image, and the input pads 475 may be connected to the external device capable of generating a plurality of signals.

Each of the input pad 475 and the output pad 470 may include a metal, an alloy of a metal, metal nitride, conductive metal oxide, transparent conductive material, etc. For example, each of the input pad 475 and the output pad 470 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an alloy of aluminum, aluminum nitride (AlNx), an alloy of silver, tungsten nitride (WNx), an alloy of copper, an alloy of molybdenum, titanium nitride (TiNx), chromium nitride (CrNx), tantalum nitride (TaNx), strontium ruthenium oxide (SRO), zinc oxide (ZnOx), indium tin oxide (ITO), stannum oxide (SnOx), indium oxide (InOx), gallium oxide (GaOx), indium zinc oxide (IZO), etc. These may be used alone or in a combination thereof. In an exemplary embodiment of the present inventive concept, each of the input pad 475 and the output pad 470 may have a multi-layered structure including a plurality of layers. In addition, the input pad 475 and the input pad wiring 550 may be integrally formed using same materials, and the output pad 470 and the output pad wiring 590 may be integrally formed using same materials. For example, after a preliminary electrode layer is formed on the entire base substrate 510, the input pad wiring 550, the output pad wiring 590, the input pad 475, and the output pad 470 may be simultaneously (or concurrently) formed by selectively etching the preliminary electrode layer.

As the chip on film package 500 according to an exemplary embodiment of the present inventive concept includes the protection layer 610 having the protrusion 611 and in a process for bonding the pad electrodes of a display device and the output pads 470 of the chip on film package 500, although the alignment error may occur, the pad electrode of the display device might not be in contact with the lower output pad wiring 591 because the protrusion 611 of the protection layer 610 covers the lower output pad wiring 591. Accordingly, a contact failure of the lower output pad wiring 591 of the chip on film package 500 and the pad electrodes of the display device may be prevented.

Figure 4A:
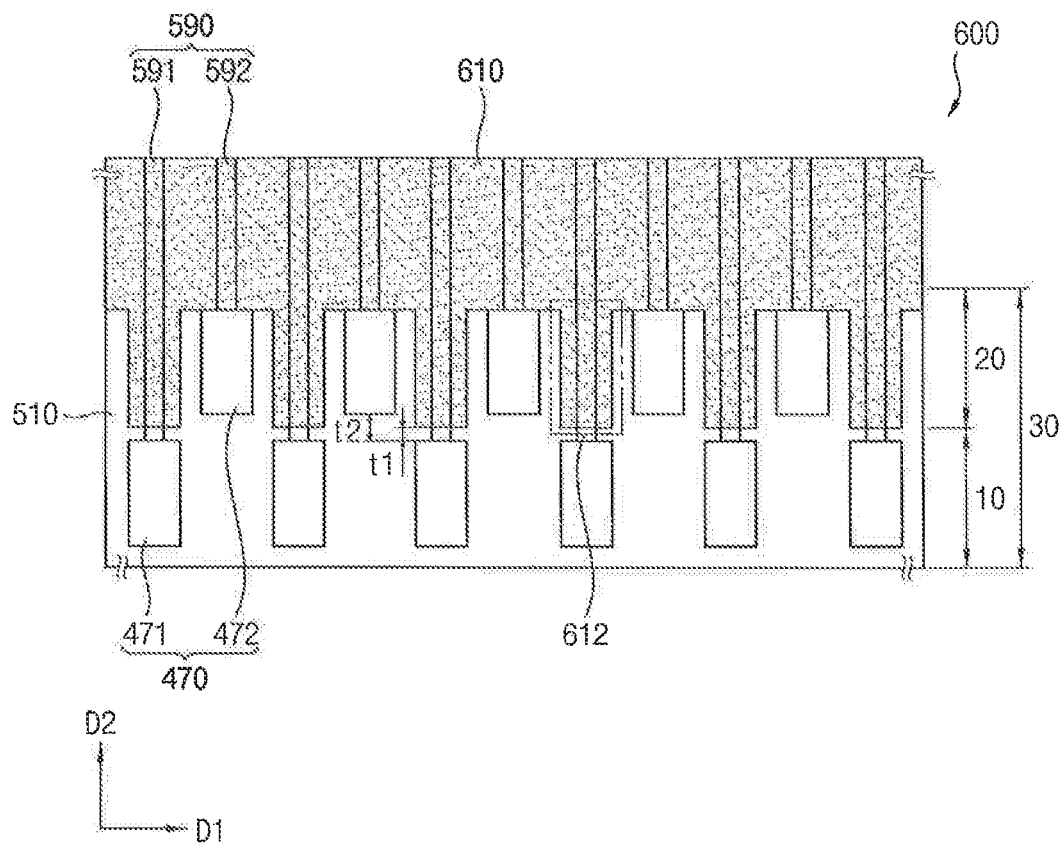
FIG. 4A is a plan view illustrating a chip on film package according to an exemplary embodiment of the present inventive concept.
Figure 4B:
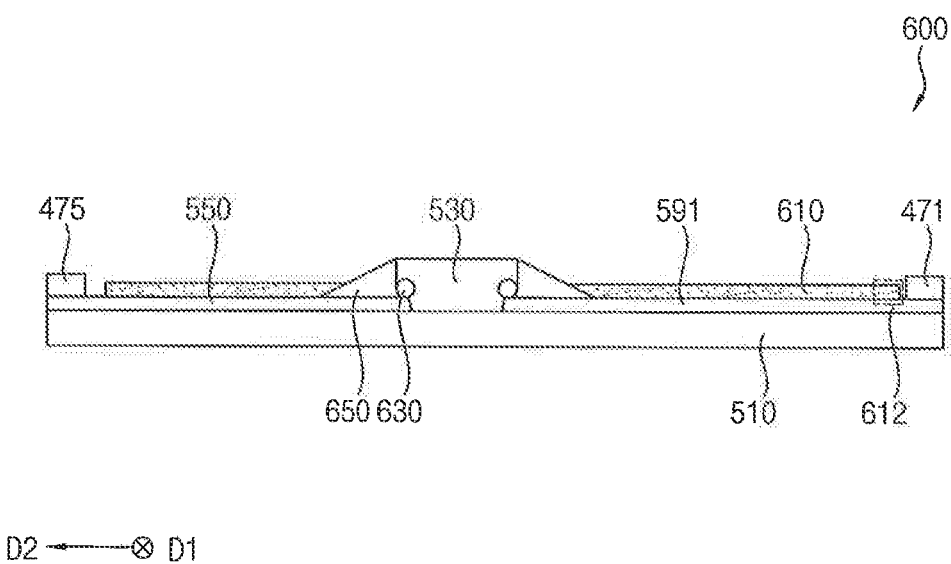
FIG. 4B is a cross-sectional view for describing the chip on film package of FIG. 4A according to an exemplary embodiment of the present inventive concept.

FIG. 4A is a plan view illustrating a chip on film package according to an exemplary embodiment of the present inventive concept, and FIG. 4B is a cross-sectional view for describing the chip on film package of FIG. 4A according to an exemplary embodiment of the present inventive concept. A chip on film package 600 illustrated in FIGS. 4A and 4B may have a configuration substantially the same as or similar to that of a chip on film package 500 described with reference to FIGS. 1 through 3 except for a shape of a protection layer 610. In FIGS. 4A and 4B, detailed descriptions for elements that are substantially the same as or similar to elements described with reference to FIGS. 1 through 3 might not be repeated.

Referring to FIGS. 1, 4A, and 4B, a chip on film package 600 may include a base substrate 510, a driving IC chip 530, a plurality of output pads 470, a plurality of input pads 475, a plurality of output pad wirings 590, a protection layer 610, a plurality of input pad wirings 550, an electrode bump 630, and an encapsulation pattern 650. Here, the output pads 470 may include lower output pads 471 and upper output pads 472, and the output pad wirings 590 may include lower output pad wirings 591 and upper output pad wirings 592.

In an exemplary embodiment of the present inventive concept, the protection layer 610 may be disposed on the lower output pad wiring 591 between two adjacent upper output pads 472, which are located in the first direction D1, among the upper output pads 472. In other words, the lower output pad wiring 591 that is connected to the lower output pad 471 may be disposed between the two adjacent upper output pads 472, and the protection layer 610 may have a protrusion 612 covering the lower output pad wiring 591 disposed between the two adjacent upper output pads 472. The protrusion 612 may be spaced apart from adjacent upper output pads 472 in the first direction D1 by a predetermined distance. In addition, the protrusion 612 may be spaced apart from the lower output pads 471 by a first distance t1 in the second direction D2. In other words, the protrusion 612 may expose a portion of the lower output pad wiring 591 located adjacent to the lower output pad 471. The first distance ti where the protrusion 612 of the protection layer 610 and the lower output pad 471 are spaced apart in the second direction D2 may be less than a second distance t2 where the lower output pad 471 and the upper output pad 472 are spaced apart in the second direction D2. For example, when the first distance t1 is formed greater than the second distance t2 and an alignment error may occur between the output pads 470 of the chip on film package 600 and pad electrodes of a display device, a contact failure may be generated when the pad electrodes of the display device contact the upper output pad wiring 592. Thus, the first distance t1 may be equal to or less than the second distance t2.

Accordingly, as the protrusion 612 is not in direct contact with the lower output pad 471, a level of a manufacturing process difficulty may be relatively decreased.

Figure 5A:
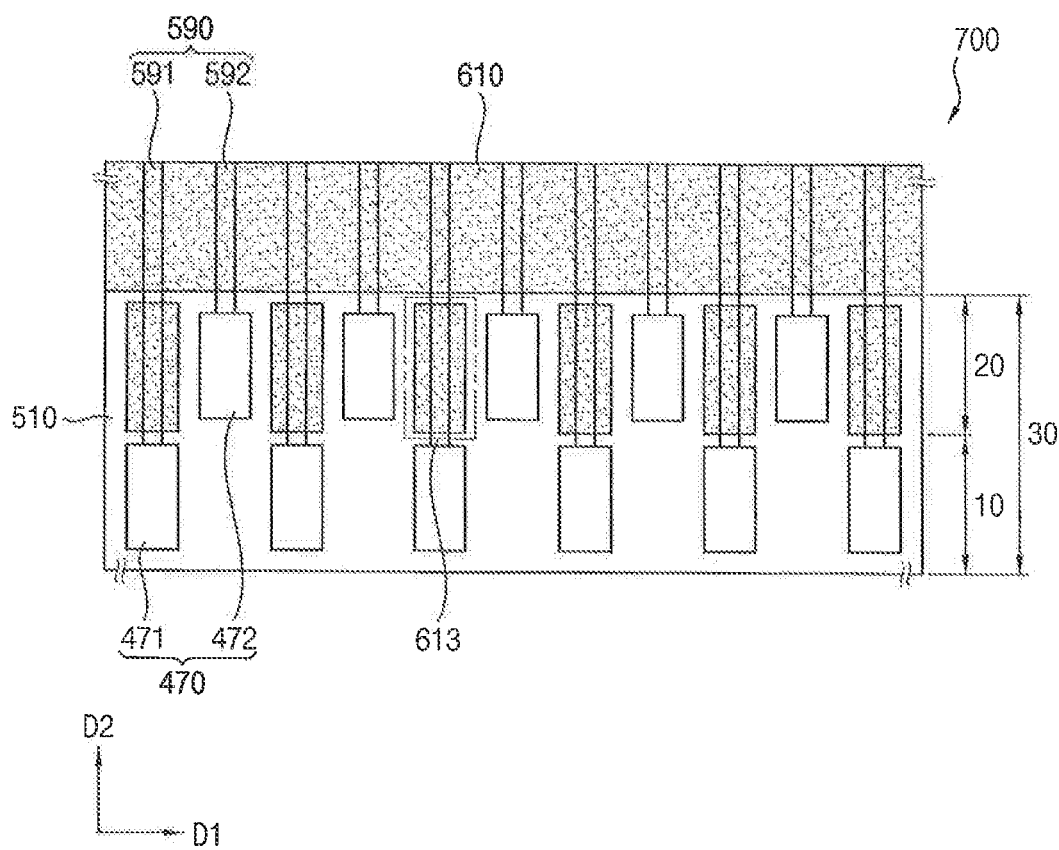
FIG. 5A is a plan view illustrating a chip on film package according to an exemplary embodiment of the present inventive concept.
Figure 5B:
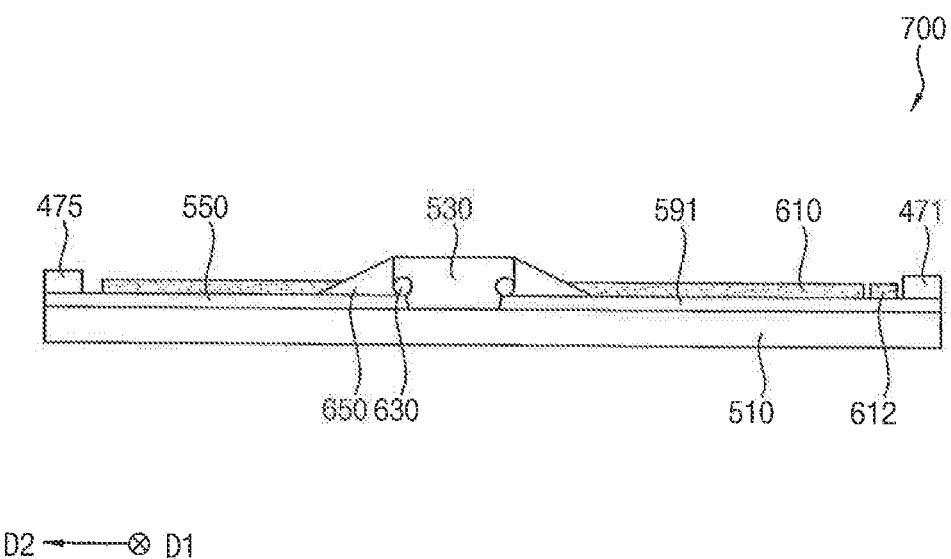
FIG. 5B is a cross-sectional view for describing the chip on film package of FIG. 5A according to an exemplary embodiment of the present inventive concept.

FIG. 5A is a plan view illustrating a chip on film package according to an exemplary embodiment of the present inventive concept, and FIG. 5B is a cross-sectional view for describing the chip on film package of FIG. 5A according to an exemplary embodiment of the present inventive concept. A chip on film package 700 illustrated in FIGS. 5A and 5B may have a configuration substantially the same as or similar to that of a chip on film package 500 described with reference to FIGS. 1 through 3 except for a protection layer pattern 613. In FIGS. 5A and 5B, detailed descriptions for elements that are substantially the same as or similar to elements described with reference to FIGS. 1 through 3 might not be repeated.

Referring to FIGS. 1, 5A, and 5B, a chip on film package 700 may include a base substrate 510, a driving IC chip 530, a plurality of output pads 470, a plurality of input pads 475, a plurality of output pad wirings 590, a protection layer 610, a protection layer pattern 613, a plurality of input pad wirings 550, an electrode bump 630, and an encapsulation pattern 650. Here, the output pads 470 may include lower output pads 471 and upper output pads 472, and the output pad wirings 590 may include lower output pad wirings 591 and upper output pad wirings 592.

The protection layer 610 may be disposed on the input pad wiring 550 and the output pad wiring 590. For example, the protection layer 610 may be disposed in the pad wiring region 50 on the base substrate 510. The protection layer 610 may protect the input pad wiring 550 and the output pad wiring 590.

The protection layer pattern 613 may be disposed in the second region 20 on the base substrate 510. The protection layer pattern 613 may be spaced apart from the protection layer 610 and the lower output pad 471 in the second region 20. In an exemplary embodiment of the present inventive concept, the protection layer pattern 613 may be disposed on the lower output pad wiring 591 disposed between two adjacent upper output pads 472, which are located in the first direction D1, among the upper output pads 472. In other words, the lower output pad wiring 591 connected to the lower output pad 471 may be disposed between the two adjacent upper output pads 472, and the chip on film package 700 may have the protection layer pattern 613 covering the lower output pad wiring 591 disposed between the two adjacent upper output pads 472.

Accordingly, if an alignment error occurs between the output pad 470 of the chip on film package 700 and pad electrodes of a display device, the pad electrodes of the display device might not be in contact with lower output pad wiring 591 because the protection layer pattern 613 covers the lower output pad wiring 591 disposed between the two adjacent upper output pads 472.

Figure 6A:
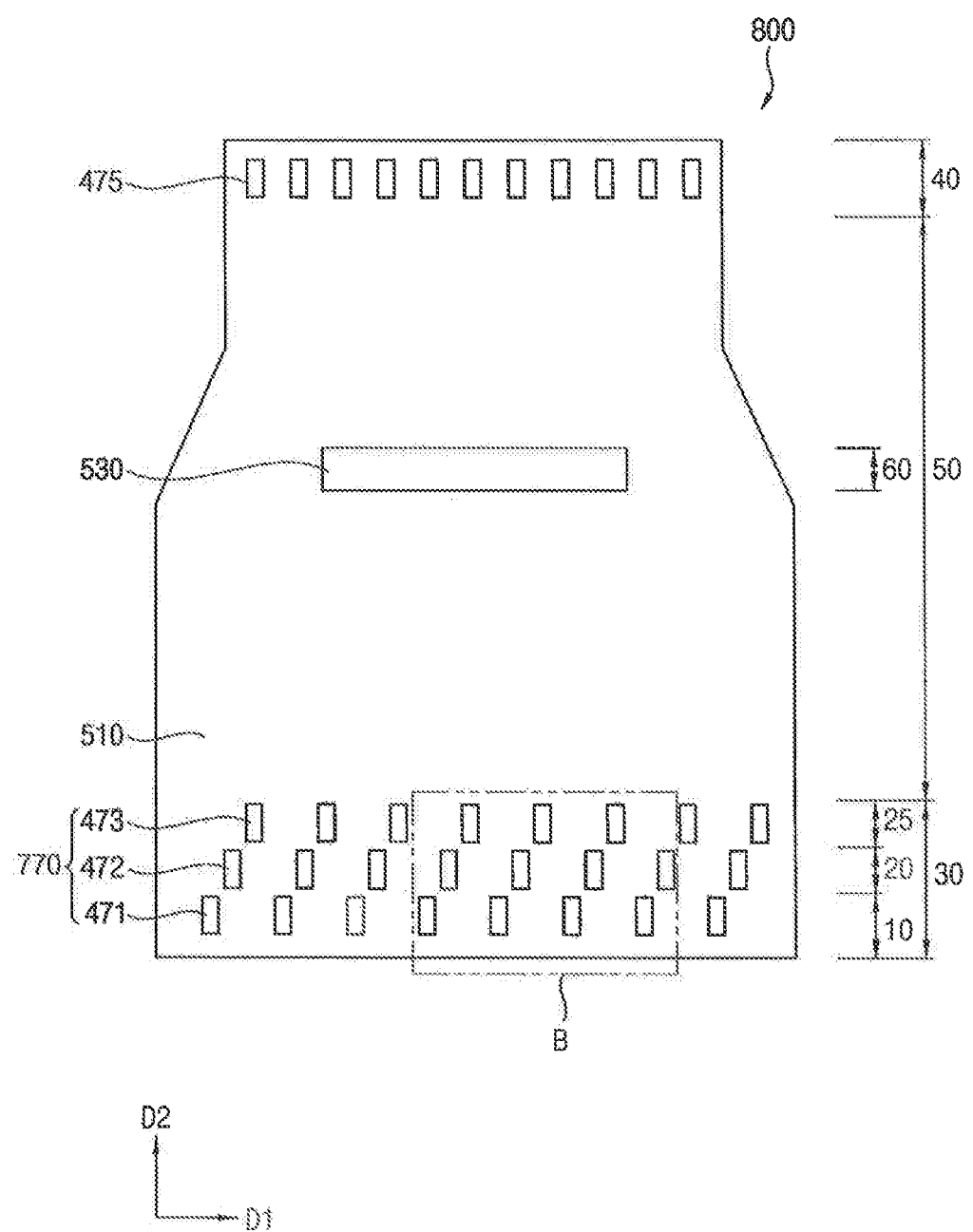
FIG. 6A is a plan view illustrating a chip on film package according to an exemplary embodiment of the present inventive concept.
Figure 6B:
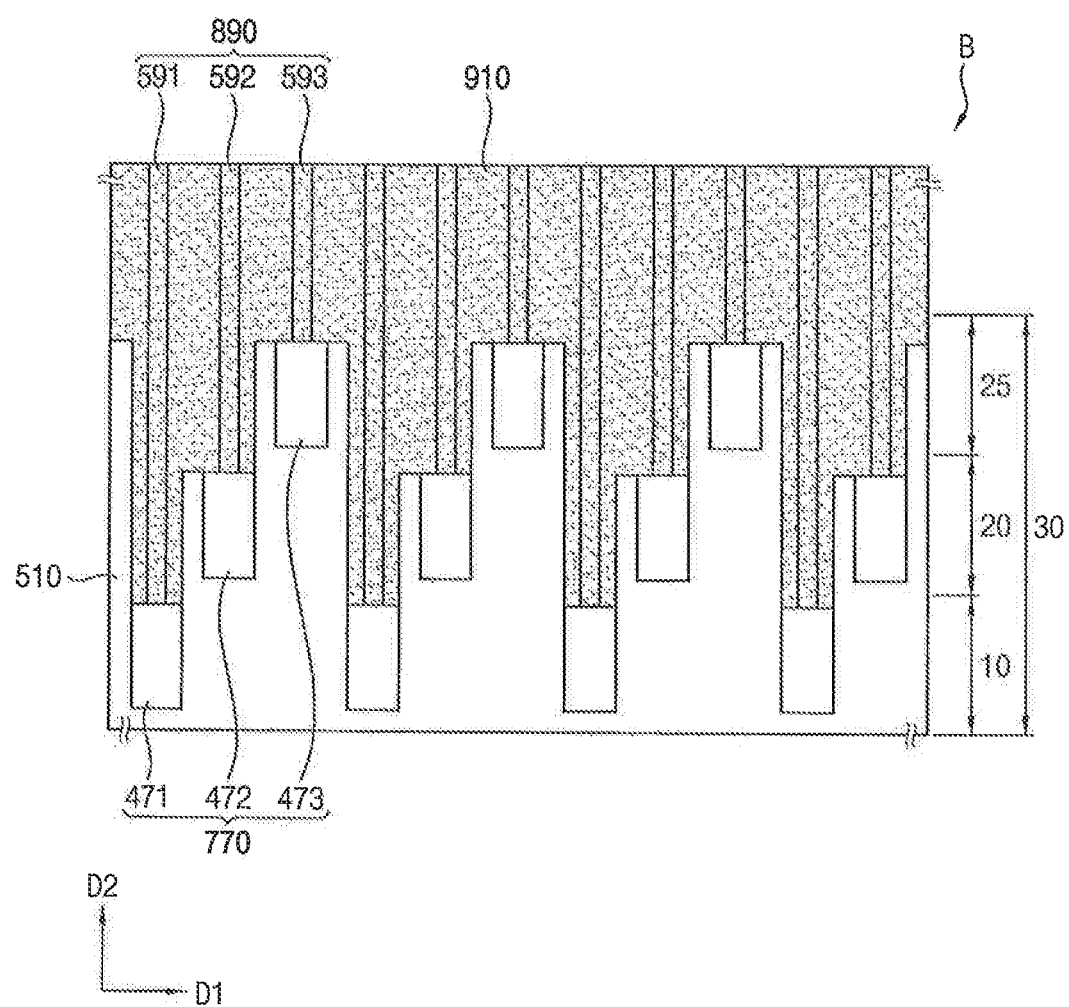
FIG. 6B is an enlarged plan view corresponding to region 'B' of the chip on film package of FIG. 6A according to an exemplary embodiment of the present inventive concept.

FIG. 6A is a plan view illustrating a chip on film package according to an exemplary embodiment of the present inventive concept, and FIG. 6B is an enlarged plan view corresponding to region of the chip on film package of FIG. 6A according to an exemplary embodiment of the present inventive concept. A chip on film package 800 illustrated in FIGS. 5A and 5B may have a configuration substantially the same as or similar to that of a chip on film package 500 described with reference to FIGS. 1 through 3 except for an output pad 770, an output pad wiring 890, and a protection layer 910. In FIGS. 6A and 6B, detailed descriptions for elements that are substantially the same as or similar to elements described with reference to FIGS. 1 through 3 might not be repeated.

Referring to FIGS. 3, 6A, and 6B, a chip on film package 800 may include a base substrate 510, a driving IC chip 530, a plurality of output pads 770, a plurality of input pads 475, a plurality of output pad wirings 890, a protection layer 910, a plurality of input pad wirings 550, an electrode bump 630, and an encapsulation pattern 650. Here, the output pads 770 may include lower output pads 471, middle output pads 472, upper output pads 473, and the output pad wirings 890 may include lower output pad wirings 591, middle output pad wirings 592 and upper output pad wirings 593. For example, the output pads 770 and input pads 475 may be arranged in the first direction D1 that is parallel to an upper surface of the base substrate 510, and the output pad wirings 890 and the input pad wirings 550 may extend in the second direction D2 that is perpendicular to the first direction D1. In addition, the output pad wirings 890 and the input pad wirings 550 may be arranged in the first direction D1. Here, the input pad wiring 550 may connect the input pad 475 and the driving IC chip 530, and the output pad wiring 890 may connect the output pad 770 and the driving IC chip 530.

As illustrated in FIG. 6A, the base substrate 510 may have an output pad region 30, an input pad region 40, a driving IC region 60, and a pad wiring region 50. Here, the output pad region 30 may include a first region 10, a second region 20, and a third region 25.

The output pad region 30 may be located in a first side portion of the base substrate 510, and the input pad region 40 may be located in a second side portion, which is opposite to the first side portion, of the base substrate 510. Here, the first region 10 of the output pad region 30 may be located adjacent to the first side portion, and the third region 25 may be located to be spaced apart from the first side portion by the second direction D2. The second region 20 may be interposed between the first region 10 and the third region 25. The pad wiring region 50 may be disposed between the output pad region 30 and the input pad region 40, and the driving IC region 60 may be located in a portion of the pad wiring region 50.

The lower output pads 471 may be disposed in the first region 10, and the middle output pads 472 may be disposed in the second region 20. The upper output pads 473 may be disposed in the third region 25. In addition, the input pads 475 may be disposed in the input pad region 40. Further, the input pad wirings 550 and the output pad wirings 890 may be disposed in the pad wiring region 50, and the driving IC chip 530 may be disposed in the driving IC region 60.

The lower output pads 471 may be arranged along the first direction DI in the first region 10 of the output pad region 30, and the middle output pads 472 may be arranged along the first direction D1 in the second region 20 of the output pad region 30. The upper output pads 473 may be arranged along the first direction D1 in the third region 25 of the output pad region 30. In an exemplary embodiment of the present inventive concept, the lower output pads 471, the middle output pads 472, and the upper output pads 473 may be alternately disposed in the first direction D1, and the lower output pads 471 might not overlap each of the middle output pads 472 and the upper output pads 473 in the second direction D2. In addition, the middle output pads 472 might not overlap each of the lower output pad 471 and the upper output pads 473 in the second direction D2. Further, the upper output pads 473 might not overlap each of the lower output pad 471 and the middle output pads 472 in the second direction D2. For example, the lower output pads 471 in the first region 10 may be misaligned with middle output pads 472 in the second region 20 and the upper output pads 473 in the third region 25. Further, the middle output pads 472 in the second region 20 may be misaligned with the upper output pads 473 in the third region 25.

Each of the lower output pad wirings 591 may be connected to each of the lower output pads 471, and each of the middle output pad wirings 592 may be connected to each of the middle output pads 472. Each of the upper output pad wirings 593 may be connected to each of the upper output pads 473. For example, a first end of the lower output pad wiring 591 may be connected to the lower output pad 471, and a second end, which is different from the first end, of the lower output pad wiring 591 may be connected to the driving IC chip 530. In addition, a first end of the middle output pad wiring 592 may be connected to the middle output pad 472, and a second end, which is different from the first end, of the middle output pad wiring 592 may be connected to the driving IC chip 530. Further, a first end of the upper output pad wiring 593 may be connected to the upper output pad 473, and a second end, which is different from the first end, of the upper output pad wiring 593 may be connected to the driving IC chip 530.

In an exemplary embodiment of the present inventive concept, the lower output pad wiring 591 and the middle output pad wiring 592 between two adjacent upper output pads 473, which are located in the first direction D1 among the upper output pads 473 may be completely covered by the protection layer 910. In other words, the lower output pad wiring 591 that is connected to the lower output pad 471 and the middle output pad wiring 592 that is connected to the middle output pad 472 may be disposed between the two adjacent upper output pads 473, and the protection layer 910 may have a protrusion covering the lower output pad wiring 591 and the middle output pad wiring 592 disposed between the two adjacent the upper output pads 473. Here, the protection layer 910 may be disposed in the pad wiring region 50, the third region 25, and the second region 20 on the base substrate 510, and the protrusion may correspond to a portion where the protection layer 910 is disposed in the third region 25 and the second region 20. In other words, in the protection layer 910, the protrusion of the protection layer 910 may be a portion protruded from a boundary of the pad wiring region 50 and into the output pad region 30 by a direction that is opposite to the second direction D2. The protrusion may be in direct contact with the middle output pads 472 and the lower output pads 471. In addition, the protrusion may be in direct contact with the two adjacent upper output pads 473 by enlarging a width in the first direction D1 of the protrusion.

Figure 7:
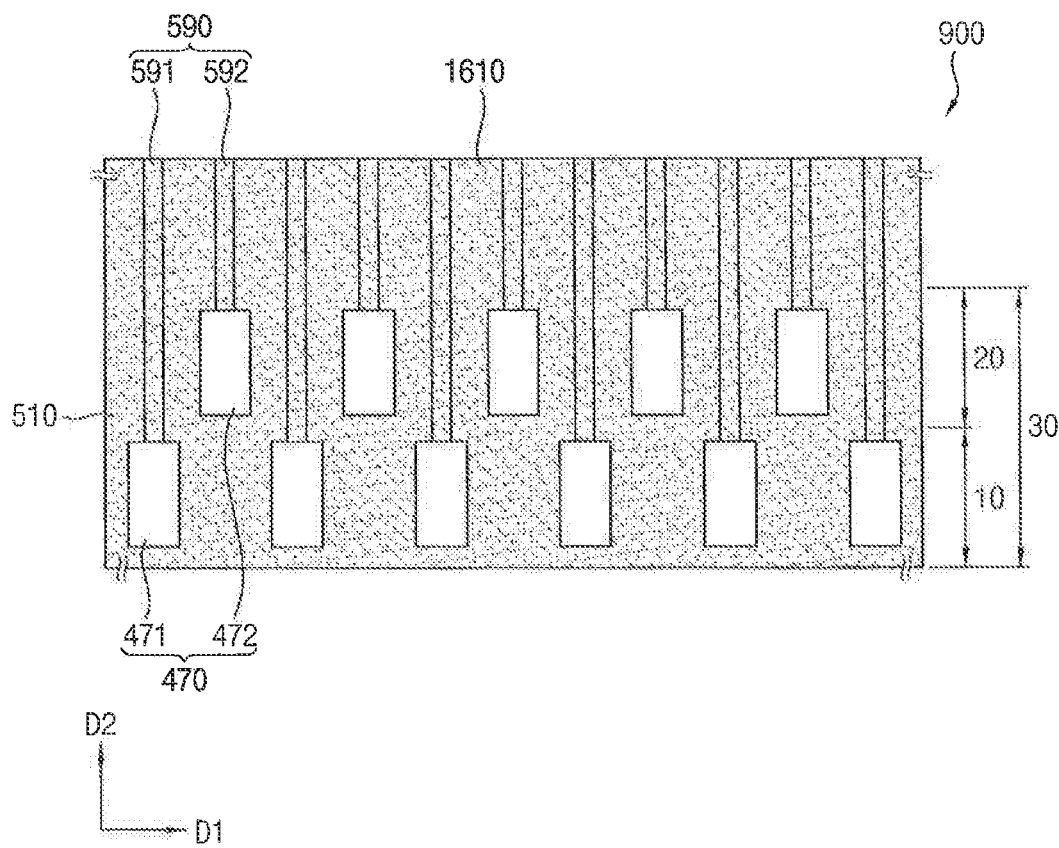
FIG. 7 is a plan view illustrating a chip on film package according to an exemplary embodiment of the present inventive concept.
Figure 8:
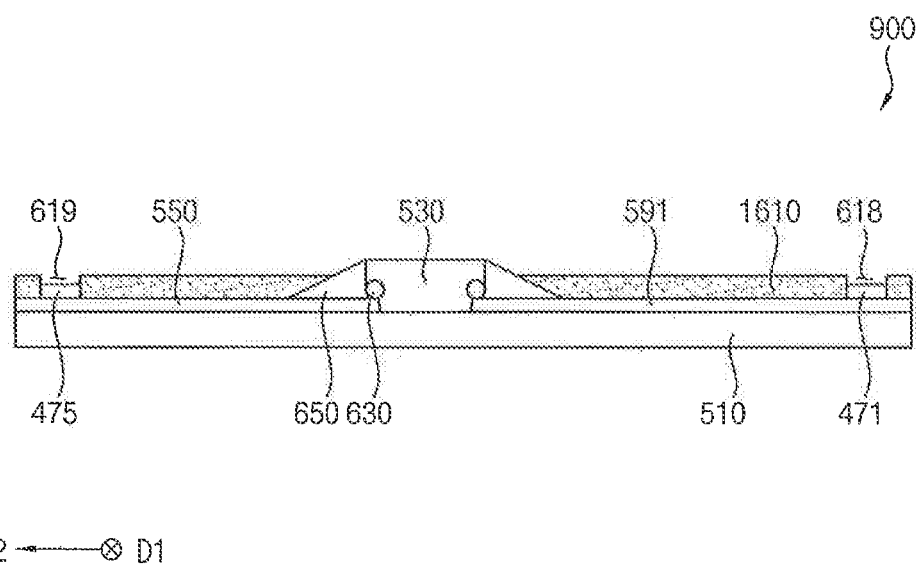
FIG. 8 is a cross-sectional view for describing the chip on film package of FIG. 7 according to an exemplary embodiment of the present inventive concept.

FIG. 7 is a plan view illustrating a chip on film package according to an exemplary embodiment of the present inventive concept, and FIG. 8 is a cross-sectional view for describing the chip on film package of FIG. 7 according to an exemplary embodiment of the present inventive concept. A chip on film package 900 illustrated in FIGS. 7 and 8 may have a configuration substantially the same as or similar to that of a chip on film package 500 described with reference to FIGS. 1 through 3 except for a protection layer 1610. In FIGS. 7 and 8, detailed descriptions for elements that are substantially the same as or similar to elements described with reference to FIGS. 1 through 3 might not be repeated.

Referring to FIGS. 1, 7, and 8, a chip on film package 900 may include a base substrate 510, a driving IC chip 530, a plurality of output pads 470, a plurality of input pads 475, a plurality of output pad wirings 590, a protection layer 1610, a plurality of input pad wirings 550, an electrode bump 630, and an encapsulation pattern 650. Here, the output pads 470 may include lower output pads 471 and upper output pads 472, and the output pad wirings 590 may include lower output pad wirings 591 and upper output pad wirings 592. For example, the output pads 470 and the input pads 475 may be arranged in a first direction D1 that is in parallel to an upper surface of the base substrate 510, and the output pad wirings 590 and the input pad wirings 550 may extend in a second direction D2 that is perpendicular to the first direction D1. In addition, the output pad wirings 590 and the input pad wirings 550 may be arranged in the first direction D1. Here, the input pad wirings 550 may connect the input pads 475 and the driving IC chip 530, and the output pad wirings 590 may connect the output pads 470 and the driving IC chip 530.

In an exemplary embodiment of the present inventive concept, in a plan view of FIG. 7, the output pads 470 may be alternately arranged in a zigzag manner on a plan surface of the base substrate 510. In addition, in a plan view of FIG. 7, the protection layer 1610 may be disposed on the output pad wirings 590 disposed between two adjacent output pads 470, which are located in the first direction D1, among the output pads 470.

The protection layer 1610 may completely cover the input pad wiring 550 and the output pad wiring 590 on the base substrate 510, and may have an opening 619 exposing the input pad 475 and an opening 618 exposing the output pad 470. As the protection layer 1610 completely covers the input pad wiring 550 and the output pad wiring 590, although the alignment error occurs between the output pad 470 of the chip on film package 900 and pad electrodes of a display device, a contact failure of the upper output pad wiring 592 of the chip on film package 900 and the pad electrodes of the display device may be prevented. In addition, the protection layer 1610 has an opening 619 exposing the input pad 475 and an opening 618 exposing the output pad 470. The pad electrodes of the display device may be relatively readily aligned in the output pad 470 due to the opening 618 when the output pad 470 of the chip on film package 900 and the pad electrodes of the display device are aligned.

Figure 9:
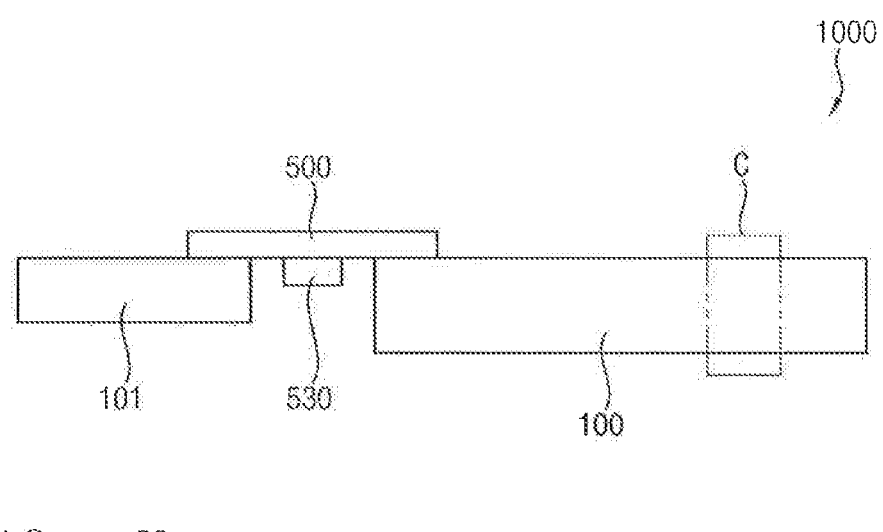
FIG. 9 is a cross-sectional view illustrating a display panel according to an exemplary embodiment of the present inventive concept.
Figure 10:
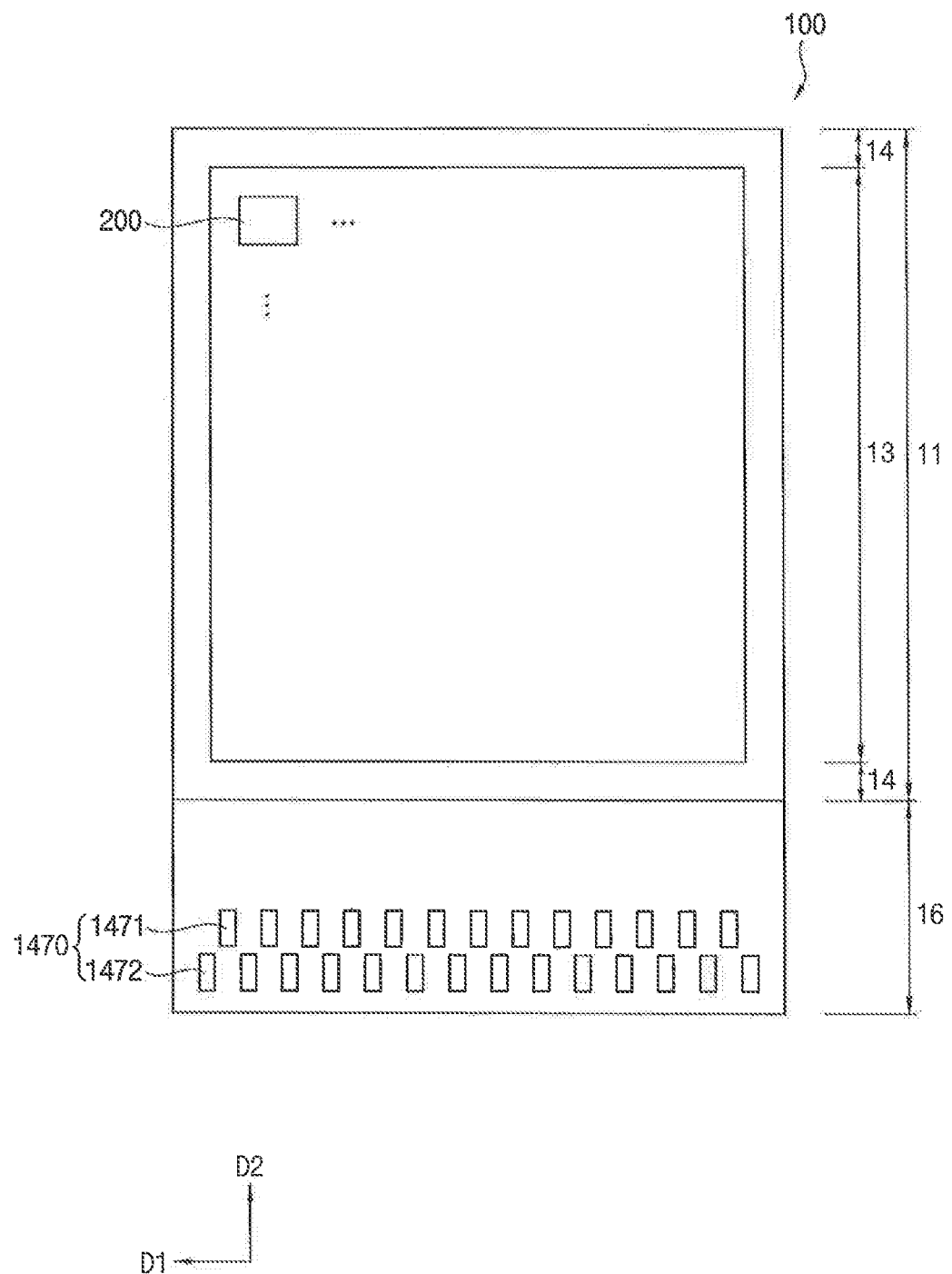
FIG. 10 is a plan view for describing the display panel included in the display device of FIG. 9 according to an exemplary embodiment of the present inventive concept.
Figure 11:
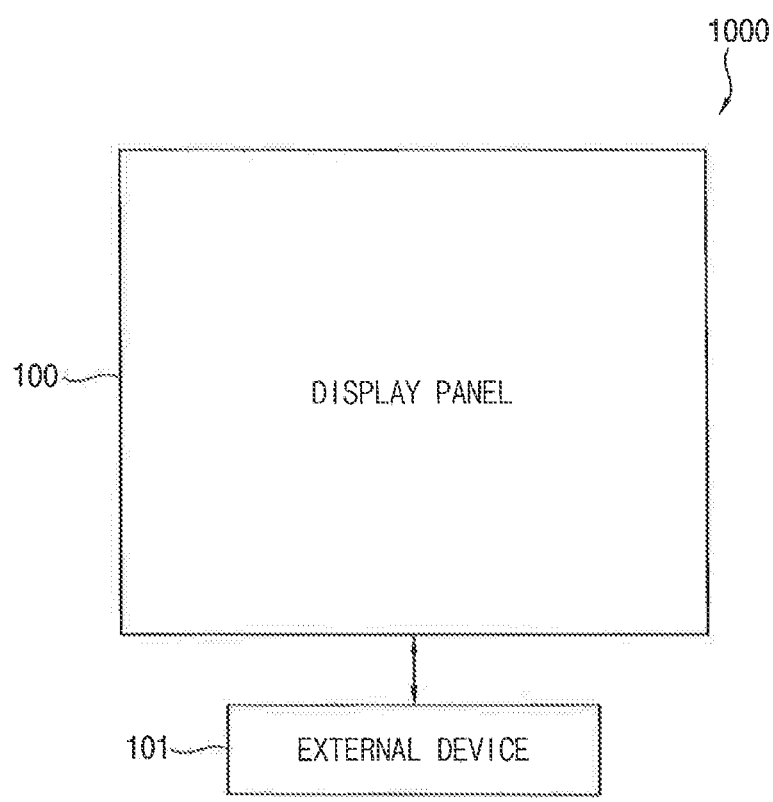
FIG. 11 is a block diagram for describing an external device electrically connected to a display panel included in the display device of FIG. 9 according to an exemplary embodiment of the present inventive concept.
Figure 12:
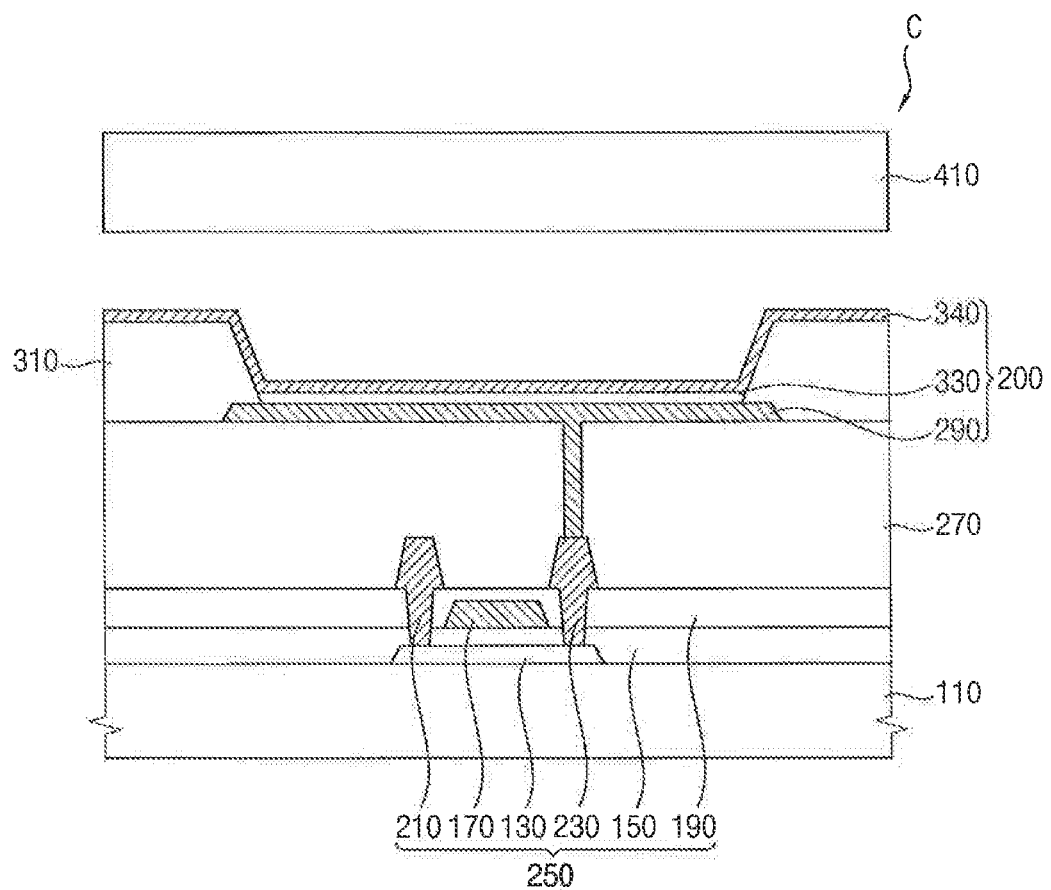
FIG. 12 is an enlarged plan view corresponding to region 'C' of FIG. 9 according to an exemplary embodiment of the present inventive concept.
Figure 13:
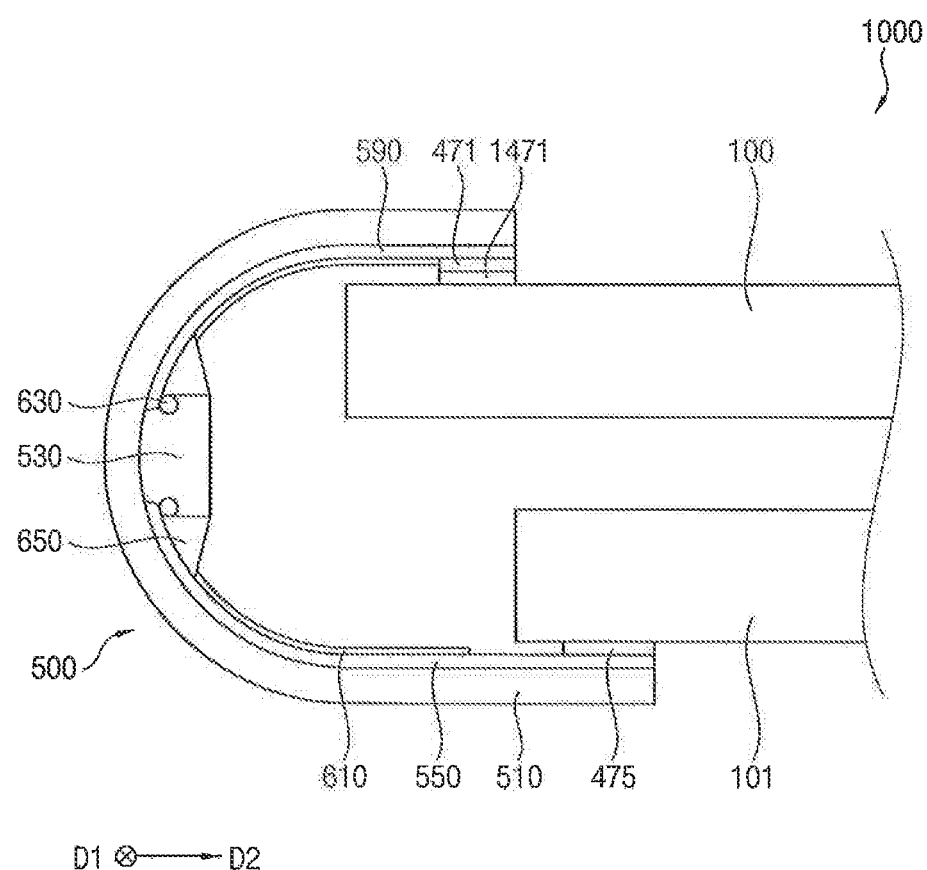
FIG. 13 is a cross-sectional view for describing a bent shape of a chip on film package included in the display device of FIG. 9 according to an exemplary embodiment of the present inventive concept.

FIG. 9 is a cross-sectional view illustrating a display panel according to an exemplary embodiment of the present inventive concept, and FIG. 10 is a plan view for describing the display panel included in the display device of FIG. 9 according to an exemplary embodiment of the present inventive concept. FIG. 11 is a block diagram for describing an external device electrically connected to a display panel included in the display device of FIG. 9 according to an exemplary embodiment of the present inventive concept, and FIG. 12 is an enlarged plan view corresponding to region 'C' of FIG. 9 according to an exemplary embodiment of the present inventive concept. FIG. 13 is a cross-sectional view for describing a bent shape of a chip on film package included in the display device of FIG. 9 according to an exemplary embodiment of the present inventive concept. A display device 1000 illustrated in FIGS. 9, 10, 11, 12, and 13 may have a configuration including a chip on film package 500 described with reference to FIGS. 1 through 3 except for a protection layer 1610. In FIGS. 9, 10, 11, 12, and 13, detailed descriptions for elements that are substantially the same as or similar to elements described with reference to FIGS. 1 through 3 might not be repeated.

Referring to FIGS. 9, 10, 11, 12, and 13, a display device 1000 may include a display panel 100, a chip on film package 500, and an external device 101. Here, the display panel 100 may include pad electrodes 1470, a substrate 110, a semiconductor element 250, a planarization layer 270, a pixel defining layer 310, a pixel structure 200, and an encapsulation substrate 410. In addition, the semiconductor element 250 may include an active layer 130, a gate insulation layer 150, a gate electrode 170, an insulating interlayer 190, a source electrode 210, and a drain electrode 230. Further, the pixel structure 200 may include a lower electrode 290 (e.g., a pixel electrode), a light emitting layer 330, and an upper electrode 340. Further, the chip on film package 500 may include a base substrate 510, a driving IC chip 530, a plurality of output pads 470, a plurality of input pads 475, a plurality of output pad wirings 590, a protection layer 610, a plurality of input pad wirings 550, an electrode hump 630, and an encapsulation pattern 650. Here, the output pads 470 may include lower output pads 471 and upper output pads 472, and the output pad wirings 590 may include lower output pad wirings 591 and upper output pad wirings 592. For example, the output pads 470 and the input pads 475 may be arranged in a first direction D1 that is in parallel to an upper surface of the base substrate 510, and the output pad wirings 590 and the input pad wirings 550 may extend in a second direction D2 that is perpendicular to the first direction D1. In addition, the output pad wirings 590 and the input pad wirings 550 may be arranged in the first direction D1. Here, the input pad wirings 550 may connect the input pads 475 and the driving IC chip 530, and the output pad wirings 590 may connect the output pads 470 and the driving IC chip 530.

The display panel 100 may display an image, and the chip on film package 500 may be connected to a first side of the display panel 100. For example, a first side of the chip on film package 500 may be connected to the display panel 100, and a second side of the chip on film package 500 may be connected to the external device 101.

As illustrated in FIG. 10, the display panel 100 may have a display region 11 and a pad region 16. Here, the display region 11 may include a pixel region 13 and a peripheral region 14 surrounding the pixel region 13. A plurality of pixel structures 200 may be disposed in the display region 11, and the pad region 16 may be located in a first side of the display region 11. For example, the pad region 16 may be adjacent to a first side of the display region 11. The pad electrodes 1470 that are electrically connected to the chip on film package 500 may be disposed in the pad region 16.

The pixel structure 200 capable of emitting light may be disposed in the pixel region 13, and a plurality of wirings may be disposed in the input pad region 40. The wirings may electrically connect the output pad 470 and the pixel structure 200. For example, a distal end of the wiring may be connected to the pad electrodes 1470. In addition, the wiring may extend from the input pad region 40 into the pixel region 13, and an extension of the wirings disposed in the pixel region 13 may be connected to the pixel structures 200. The wirings may include data signal wirings, scan signal wirings, light emitting signal wirings, power supply voltage wirings, touch screen wirings, etc. In addition, a scan driver, a data driver, etc. may be disposed in the peripheral region 14.

The pad electrode 1470 may include a lower pad electrode 1472 and an upper pad electrode 1471. In an exemplary embodiment of the present inventive concept, in a plan view of FIG. 10, the pad electrodes 1470 may be arranged in a zigzag on a plan surface of the display panel 100. For example, the lower pad electrodes 1472 and the upper pad electrodes 1471 may he alternately arranged along the first direction D1 in different rows. In addition, each of the lower pad electrodes 1472 of the display panel 100 may correspond to each of the upper output pads 472 of the chip on film package 500, and each of the upper pad electrodes 1471 of the display panel 100 may correspond to each of the lower output pads 471 of the chip on film package 500. For example, each of the lower pad electrodes 1472 of the display panel 100 may be aligned to each of the upper output pads 472 of the chip on film package 500, and each of the upper pad electrode 1471 of the display panel 100 may be aligned to each of the lower output pads 471 of the chip on film package 500.

In other words, a plurality of the output pads 470 may include first through (M)th lower output pads 471 and first through (N)th upper output pads 472, where M is an integer greater than 1 and N is an integer greater than 1. A plurality of the output pad wirings 590 may include first through (P)th lower output pad wirings 591 and first through (Q)th upper output pad wirings 592, where P is an integer greater than 1 and P and Q is an integer greater than 1.

According to an exemplary embodiment of the present inventive concept, the first through (M)th lower output pads 471 and the first through (N)th upper output pads 472 may be alternately arranged along the first direction D1 in different rows. In addition, the (K)th lower output pad among the first through (M)th lower output pads 471 may be connected to the (L)th lower output pad wiring among the first through (P)th lower output pad wirings 591, where K is an integer between 1 and M, and L is an integer between 1 and M. The (G)th upper output pad among the first through (N)th upper output pads 472 may be connected to the (H)th upper, output pad wiring among the first through (Q)th upper output pad wirings 592, where G is an integer between 1 and M, and H is an integer between 1 and M. Further, the (L)th lower output pad wiring disposed between the (G)th and (G+1)th upper output pads may be completely covered by the protection layer 610.

In addition, a plurality of the pad electrode 1470 may include first through (R)th lower pad electrodes 1472 and first through (S)th upper pad electrodes 1471, where R is an integer greater than 1, and S is an integer greater than 1. The first through (R)th lower pad electrodes 1472 and the first through (S)th upper pad electrodes 1471 may be alternately arranged along the first direction D in different rows. In an exemplary embodiment of the present inventive concept, the (E)th lower pad electrode among the first through (R)th lower pad electrodes 1472 may be connected to the (G)th upper output pad, and the (F)th upper pad electrode among the first through (S)th upper pad electrodes 1471 may be connected to the (K)th lower output pad, where E is an integer between 1 and R, and F is an integer between 1 and S.

As illustrated in FIG. 11, the external device 101 may generate data signals, scan signals, light emission signals, power supply voltages, touch sensing signals, etc., and may provide the data signals, the scan signals, the light emission signals, the power supply voltages, the touch sensing signals, etc., to the display panel 100 through the chip on film package 500.

As illustrated in FIG. 10, the display panel 100 may be configured as follows.

For example, the substrate 110 may be provided. The substrate 110 may include transparent or opaque materials. The substrate 110 may include, for example, a quartz substrate, a synthetic quartz substrate, a calcium fluoride substrate, a fluoride-doped quartz substrate, a soda-lime glass substrate, a non-alkali glass substrate etc. In addition, the substrate 110 may include a flexible transparent material such as a flexible transparent resin substrate (e.g., a polyimide substrate). In this case, the polyimide substrate may include, for example, a first polyimide layer, a first barrier film layer, a second polyimide layer, a second barrier film layer, etc. Since the polyimide substrate is relatively thin and flexible, the polyimide substrate may be formed on a rigid glass substrate to help support the formation of the semiconductor element 250 and the pixel structure 200. In other words, the substrate 110 may have a structure in which the first polyimide layer, the first barrier film layer, the second polyimide layer, and the second barrier film layer are stacked on the rigid glass substrate. In a manufacturing process of the display device, after an insulating layer (e.g., a buffer layer) is provided on the second polyimide layer of the polyimide substrate, the semiconductor element 250 and the pixel structure 200 may be formed on the buffer layer. After the semiconductor element 250 and the pixel structure 200 are formed on the buffer layer, the rigid glass substrate on which the polyimide substrate is formed may be removed. In other words, it may be difficult to directly form the semiconductor element 250 and the pixel structure 200 on the polyimide substrate because the polyimide substrate is relatively thin and flexible. Accordingly, the semiconductor element 250 and the pixel structure 200 are formed on the polyimide substrate and the rigid glass substrate, and then the polyimide substrate may serve as the substrate 110 after the removal of the rigid glass substrate.

A buffer layer may be disposed on the substrate 110. For example, the buffer layer may be disposed on the entire substrate 110. The buffer layer may prevent the diffusion of metal atoms and/or impurities from the substrate 110. In addition, the buffer layer may control a rate of heat transfer in a crystallization process for forming the active layer 130, thereby obtaining a substantially uniform active layer 130. Further, the buffer layer may increase a surface flatness of the substrate 110 when a surface of the substrate 110 is relatively irregular or uneven. According to a type of the substrate 110, at least two buffer layers may be provided on the substrate 110, or the buffer layer might not be disposed. For example, the buffer layer may include, for example, a silicon compound, a metal oxide, etc.

The active layer 130 may be disposed on the substrate 110. For example, the active layer 130 may include an oxide semiconductor, an inorganic semiconductor (e.g., amorphous silicon, polysilicon, etc.), an organic semiconductor, etc.

The gate insulation layer 150 may be disposed on the active layer 130. The gate insulation layer 150 may cover the active layer 130, and may be disposed on the substrate 110. For example, the gate insulation layer 150 may cover an upper surface and side surfaces of the active layer 130 on the substrate 110, and may have a substantially flat upper surface without a step around the active layer 130. In addition, the gate insulation layer 150 may cover the active layer 130 on the substrate 110, and may be disposed as a substantially uniform thickness along a profile of the active layer 130. The gate insulation layer 150 may include a silicon compound, a metal oxide, etc. For example, the gate insulation layer 150 may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc.

The gate electrode 170 may be disposed on a portion of the gate insulation layer 150 under which the active layer 130 is located. The gate electrode 170 may include a metal, a metal alloy, metal nitride, conductive metal oxide, transparent conductive materials, etc. For example, the gate electrode 170 may include Au, Ag, Al, Pt, Ni, Ti, Pd, Mg, Ca, Li, Cr, Ta, W, Cu, Mo, Sc, Nd, Ir, an alloy of aluminum, AlNx, an alloy of silver, WNx, an alloy of copper, an alloy of molybdenum, TiNx, CrNx, TaNx, SRO, ZnOx, SnOx, GaOx, IZO, etc. These may be used alone or in a combination thereof. In an exemplary embodiment of the present inventive concept, the gate electrode 170 may have a multi-layered structure including a plurality of layers.

The insulating interlayer 190 may be disposed on the gate electrode 170. The insulating interlayer 190 may cover the gate electrode 170, and may be disposed on the gate insulation layer 150. For example, the insulating interlayer 190 may cover an upper surface and side surfaces of the gate electrode 170 on the gate insulation layer 150, and may have a substantially flat upper surface without a step around the gate electrode 170. In addition, the insulating interlayer 190 may cover the gate electrode 170 on the gate insulation layer 150, and may be disposed as a substantially uniform thickness along a profile of the gate electrode 170. The insulating interlayer 190 may include, for example, a silicon compound, a metal oxide, etc.

The source electrode 210 and the drain electrode 230 may be disposed on the insulating interlayer 190. The source electrode 210 may be in direct contact with a first side (e.g., a source region) of the active layer 130 via a contact hole formed by removing a portion of the gate insulation layer 150 and the insulating interlayer 190. The drain electrode 230 may be in direct contact with a second side (e.g., a drain region) of the active layer 130 via a contact hole formed by removing another portion of the gate insulation layer 150 and the insulating interlayer 190. Each of the source electrode 210 and the drain electrode 230 may include, for example, a metal, an alloy, metal nitride, conductive metal oxide, transparent conductive materials, etc. These may be used alone or in a combination thereof. In an exemplary embodiment of the present inventive concept, each of the source and drain electrodes 210 and 2.30 may have a multi-layered structure including a plurality of layers. Accordingly, the semiconductor element 250 may include the active layer 130, the gate insulation layer 150, the gate electrode 170, the insulating interlayer 190, the source electrode 210, and the drain electrode 230.

In an exemplary embodiment of the present inventive concept, the semiconductor element 250 has a top gate structure, but the present inventive concept is not being limited thereto. For example, in an exemplary embodiment of the present inventive concept, the semiconductor element 250 may have a bottom gate structure.

The planarization layer 270 may be disposed on the source electrode 210 and the drain electrode 230. The planarization layer 270 may cover the source electrode 210 and the drain electrode 230. In other words, the planarization layer 270 may be disposed on the entire insulating interlayer 190. In an exemplary embodiment of the present inventive concept, the planarization layer 270 may be disposed as a high thickness to overlap the source and drain electrodes 210 and 230. In this case, the planarization layer 270 may have a substantially flat upper surface, and a planarization process may be performed on the planarization layer 270 to implement the flat upper surface of the planarization layer 270. In addition, the planarization layer 270 may cover the source and drain electrodes 210 and 230, and may be disposed as a substantially uniform thickness along a profile of the source and drain electrodes 210 and 230. The planarization layer 270 may include organic materials or inorganic materials. In an exemplary embodiment of the present inventive concept, the planarization layer 270 may include organic materials. For example, the planarization layer 270 may include a polyimide-based resin, a photoresist, an acryl-based resin, a polyamide-based resin, a siloxane-based resin, etc.

The lower electrode 290 may be disposed on the planarization layer 270. The lower electrode 290 may be in contact with the drain electrode 230 via a contact hole formed by removing a portion of the planarization layer 270. In addition, the lower electrode 290 may be electrically connected to the semiconductor element 250. The lower electrode 290 may include, for example, a metal, a metal alloy, metal nitride, conductive metal oxide, transparent conductive materials, etc. These may be used alone or in a combination thereof. In addition, the lower electrode 290 may have a multi-layered structure including a plurality of layers.

The pixel defining layer 310 may be disposed on the planarization layer 270, and may expose a portion the lower electrode 290. For example, the pixel defining layer 310 may be partially disposed on the lower electrode 290. The pixel defining layer 310 may include organic materials or inorganic materials. In an exemplary embodiment of the present inventive concept the pixel defining layer 310 may include organic materials.

The light emitting layer 330 may be disposed on the lower electrode 290 exposed by the pixel defining layer 310. For example, the light emitting layer 330 may be disposed on the portion of the lower electrode 290 that is exposed by the pixel defining layer 310. The light emitting layer 330 may be formed using at least one of light emitting materials capable of generating different colors of light (e.g., a red color of light, a blue color of light, and a green color of light) according to sub-pixels. In addition, the light emitting layer 330 may generate a white color of light by stacking a plurality of light emitting materials capable of generating different colors of light such as a red color of light, a green color of light, and a blue color of light. In this case, a color filter may be disposed on the light emitting layer 330. The color filter may include at least one of a red color filter, a green color filter, or a blue color filter. In addition, the color filter may include a yellow color filter, a cyan color filter, or a magenta color filter. The color filter may include a photosensitive resin or a color photoresist.

The upper electrode 340 may be disposed on the pixel defining layer 310 and the light emitting layer 330. The upper electrode 340 may include, for example, a metal, a metal alloy, metal nitride, conductive metal oxide, transparent conductive materials, etc. In an exemplary embodiment of the present inventive concept, the upper electrode 340 may have a multi-layered structure. Accordingly, the pixel structure 200 may include the lower electrode 290, the light emitting layer 330, and the upper electrode 340.

An encapsulation substrate 410 may be disposed on the upper electrode 340. The encapsulation substrate 410 and the substrate 110 may include substantially the same materials. For example, the encapsulation substrate 410 may include a quartz substrate, a synthetic quartz substrate, a calcium fluoride substrate, a fluoride-doped quartz substrate, a soda-lime glass substrate, a non-alkali glass substrate, etc. In an exemplary embodiment of the present inventive concept, the encapsulation substrate 410 may include a transparent inorganic material or flexible plastic. For example, the encapsulation substrate 410 may include a flexible transparent resin substrate. In this case, to increase flexibility of the display device 1000, the encapsulation substrate 410 may include a stacked structure including at least one inorganic layer and at least one organic layer are alternately stacked. The stacked structure may include a first inorganic layer, an organic layer, and a second inorganic layer. For example, the first inorganic layer having flexibility may be disposed along a profile of the upper electrode 340, and the organic layer having the flexibility may be disposed on the first inorganic layer. The second inorganic layer having the flexibility may be disposed on the organic layer. In other words, the stacked structure may correspond to a thin film encapsulation structure that is in direct contact with the upper electrode 340.

In an exemplary embodiment of the present inventive concept, the encapsulation substrate 410 and the substrate 110 may have different materials from each other.

As illustrated in FIG. 13, the lower output pad 471 of the chip on film package 500 may be directly connected to the upper pad electrode 1471 of the display panel 100 using an anisotropic conductive film ("ACF"). In addition, the input pad 475 of the chip on film package 500 may be directly connected to a pad electrode of the external device 101 using the ACF. After the chip on film package 500 is connected to the display panel 100 and the external device 101, the chip on film package 500 may be bent. When the chip on film package 500 is bent, the external device 101 may be positioned on a lower surface of the display panel 100.

As the display device 1000 according to an exemplary embodiment of the present inventive concept includes the chip on film package 500 that includes the protection layer 610 having the protrusion 611 and in a process for bonding the pad electrode 1470 of the display panel 100 and the output pad 470 of the chip on film package 500, although an alignment error may occur, the pad electrode 1470 of the display device 1000 might not be in contact with the lower output pad wiring 591 because the protrusion 611 of the protection layer 610 covers the lower output pad wiring 591. Accordingly, a contact failure of the lower output pad wiring 591 of the chip on film package 500 and the pad electrode 1470 of the display panel 100 may be prevented.

The present inventive concept may be applied to various display devices that include a chip on film package. For example, the present inventive concept may be applied to vehicle-display device, a ship-display device, an aircraft-display device, portable communication devices, display devices for display or for information transfer, a medical-display device, etc.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A chip on film package, comprising:
a base substrate having an output pad region;
a plurality of output pads disposed in the output pad region of the base substrate, wherein the output pads are arranged in a zigzag configuration on the base substrate;
a plurality of output pad wirings connected to the output pads, respectively; and
a protection layer disposed on the output pad wirings,
wherein the protection layer includes a protrusion disposed on an output pad wiring, among the output pad wirings, disposed between two adjacent output pads, arranged in a first direction, among the output pads, and
wherein an upper surface of each of the output pads is exposed to an outside.

2. The chip on film package of claim 1, wherein the output pad region is located adjacent to a first side of the base substrate, and
wherein the output pad region includes:
a first region located adjacent to the first side; and
a second region located adjacent to the first region and spaced apart from the first side in a second direction that is perpendicular to the first direction.

3. The chip on film package of claim 2, wherein the output pads include:
lower output pads arranged along the first direction in the first region of the output pad region; and
upper output pads arranged along the first direction in the second region of the output pad region,
wherein the lower and upper output pads are alternately disposed in the first direction.

4. The chip on film package of claim 3, Wherein the lower output pads do not overlap the upper output pads in the second direction.

5. The chip on film package of claim 3, wherein the base substrate further includes:
an input pad region located adjacent to a second side, opposite to the first side, of the base substrate, and
wherein the chip on film package further comprises:
a plurality of input pads disposed in the input pad region of the base substrate; and
a driving integrated circuit chip disposed on the base substrate and between the output pads and the input pads.

6. The chip on film package of claim 5, wherein the output part wirings include:
lower output pad wirings connected to the lower output pads, respectively; and
upper output pad wirings connected to the upper output pads, respectively,
wherein a first side of each of the lower and upper output pad wirings is connected to a respective output pad of the plurality of output pads, and a second side of each of the lower and upper output pad wirings is connected to the driving integrated circuit chip.

7. The chip on film package of claim 6, wherein the lower output pad wiring disposed between two adjacent upper output pads along the first direction among the upper output pads is completely covered by the protection layer.

8. The chip on film package of claim 6, wherein the protrusion covers the lower output pad wiring disposed between the two adjacent upper output pads arranged in the first direction.

9. The chip on film package of claim 8, wherein the protrusion of the protection layer is disposed on the lower output pad wiring disposed between the two adjacent upper output pads arranged in the first direction, and exposes a portion of the lower output pad wiring located adjacent to a first lower output pad of the lower output pads such that the protrusion is spaced apart from the first lower output pad by a predetermined distance.

10. The chip on film package of claim 9. wherein a first distance is a distance between the protrusion of the protection layer and the first lower output pad in the second direction, and a second distance is a distance between the first lower output pad and an upper output pad of the two adjacent upper output pads in the second direction, wherein the first distance is less than the second distance.

11. The chip on film package of claim 1, wherein the plurality of the output pads include:
first through (M)th lower output pads, wherein M is an integer greater than 1, and
first through (N)th upper output pads, wherein N is an integer greater than 1, and
wherein the plurality of the output pad wirings include:
first through (P)th lower output pad wirings, wherein P is an integer greater than 1; and
first through (Q)th upper outputpad wirings, wherein is an integer greater than 1.

12. The chip on film package of claim 11, wherein the first through (M)th lower output pads and the first through (N)th upper output pads are alternately arranged along the first direction in different rows, and a (K)th lower output pad among the first through (M)th lower output pads is connected to an (L)th lower output pad wiring among the first through (P)th lower output pad wirings, wherein K is an integer between 1 and M and L is an integer between 1 and M, and
wherein a (G)th upper output pad among the first through (N)th upper output pads is connected to an (H)th upper output pad wiring among the first through (Q)th upper output pad wirings, wherein G is an integer between 1 and M, and H is an integer between 1 and M.

13. The chip on film package of claim 12, wherein the (L)th lower output pad wiring disposed between the (G)th upper output pad and a (G+1)th upper output pad is completely covered by the protection layer.

14. The chip on film package of claim 1, wherein an upper surface of each of the output pad wirings is in contact with a lower surface of each of the output pads.

15. A chip on film package, comprising:
a base substrate having an output pad region;
a plurality of output pads disposed in the output pad region of the base substrate, wherein the output pads are arranged in a zigzag configuration on the base substrate;
a plurality of output pad wirings connected to the output pads, respectively; and
a protection layer disposed on the output pad wirings, wherein the protection layer is disposed on the output pad wiring disposed between two adjacent output pads, arranged in a first direction, among the output pads, wherein the output pad region is located adjacent to a first side of the base substrate, wherein the output pad region includes:
- a first region located adjacent to the first side; and
- a second region located adjacent to the first region and spaced apart from the first side in a second direction that is perpendicular to the first direction, wherein the output pads include:
- lower output pads arranged along the first direction in the first region of the output pad region; and
- upper output pads arranged along the first direction in the second region of the output pad region, wherein the lower and upper output.pads are alternately disposed in the first direction, wherein the base substrate further includes:
- an input pad region located adjacent to a second side, opposite to the first side, of the base substrate, wherein the chip on film package further comprises:
- a plurality of input pads disposed in the input pad region of the base substrate; and
- a driving integrated circuit chip disposed on the base substrate and between the output pads and the input pads, wherein the output pad wirings include:
- lower output pad wirings connected to the lower output pads, respectively; and
- upper output pad wirings connected to the upper output pads, respectively, wherein a first side of each of the lower and upper output pad wirings is connected to a respective output pad of the plurality of output pads, and a second side of each of the lower and upper output pad wirings is connected to the driving integrated circuit chip, wherein the protection layer has an opening exposing the output and input pads and the driving integrated circuit chip, and is disposed on the entire base substrate to cover the output pad wirings, and wherein a height from an upper surface of the base substrate to an upper surface the protection layer is greater than a height from the upper surface of the base substrate to an upper surface of each of the output and input pads.

* * * * *